(12) United States Patent
Reese et al.

(10) Patent No.: US 9,602,046 B2
(45) Date of Patent: Mar. 21, 2017

(54) PHOTOVOLTAIC DEVICE

(75) Inventors: Jason A Reese, Auburn, MI (US);
James R Keenihan, Midland, MI (US);
Ryan S Gaston, Midland, MI (US);
Keith L Kauffmann, Ypsilanti, MI (US); Joseph A Langmaid, Caro, MI (US); Leonardo C Lopez, Midland, MI (US); Kevin D Maak, Midland, MI (US); Michael E Mills, Midland, MI (US); Narayan Ramesh, Midland, MI (US); Samar R Teli, Midland, MI (US)

(73) Assignee: Dow Global Technologies LLC, Midland, MI (US)

( * ) Notice: Subject to any disclaimer, the term of this patent is extended or adjusted under 35 U.S.C. 154(b) by 458 days.

(21) Appl. No.: 13/989,172

(22) PCT Filed: Dec. 12, 2011

(86) PCT No.: PCT/US2011/064393
§ 371 (c)(1),
(2), (4) Date: May 23, 2013

(87) PCT Pub. No.: WO2012/082608
PCT Pub. Date: Jun. 21, 2012

(65) Prior Publication Data
US 2013/0247986 A1    Sep. 26, 2013

Related U.S. Application Data

(60) Provisional application No. 61/424,325, filed on Dec. 17, 2010.

(51) Int. Cl.
*H01L 31/048* (2014.01)
*H02S 20/25* (2014.01)
*H02S 40/34* (2014.01)

(52) U.S. Cl.
CPC ............ *H02S 20/25* (2014.12); *H01L 31/048* (2013.01); *H02S 40/34* (2014.12); *Y02B 10/12* (2013.01); *Y02E 10/50* (2013.01)

(58) Field of Classification Search
CPC ........... H01L 31/0482; H01L 31/0483; H01L 31/0484; H01L 31/048; H02S 20/25; H02S 40/35; Y02B 10/12; Y02E 10/50
USPC ................................................. 136/243–265
See application file for complete search history.

(56) References Cited

U.S. PATENT DOCUMENTS 3,767,471 A    10/1973    Kasper
4,321,416 A    3/1982    Tennant
(Continued)

FOREIGN PATENT DOCUMENTS

EP    841706 A2    5/1998
EP    1032051 A2    8/2000
(Continued)

OTHER PUBLICATIONS

Japanese Office Action dated Jun. 26, 2014 for Japanese application No. 2013/544648.
(Continued)

*Primary Examiner* — James Lin
*Assistant Examiner* — Liesl C Baumann

(57) ABSTRACT

The present invention is premised upon an improved photovoltaic device ("PV device"), more particularly to an improved photovoltaic device with a multilayered photovoltaic cell assembly and a body portion joined at an interface region and including an intermediate layer, at least one interconnecting structural member, relieving feature, unique component geometry, or any combination thereof.

14 Claims, 25 Drawing Sheets

(56) References Cited

U.S. PATENT DOCUMENTS

| | | | |
|---|---|---|---|
| 4,465,575 A | 8/1984 | Love et al. | |
| 5,437,735 A | 8/1995 | Younan et al. | |
| 5,575,861 A | 11/1996 | Younan | |
| 5,590,495 A | 1/1997 | Bressler | |
| 5,986,203 A | 11/1999 | Hanoka et al. | |
| 5,990,414 A | 11/1999 | Posnansky | |
| 6,294,724 B1 | 9/2001 | Sasaoka et al. | |
| 6,840,799 B2 | 1/2005 | Yoshikawa et al. | |
| 6,875,914 B2 | 4/2005 | Guha et al. | |
| 7,365,266 B2 | 4/2008 | Heckeroth | |
| 7,578,108 B2 * | 8/2009 | Swanson | E04D 1/26 156/71 |
| 8,163,125 B2 | 4/2012 | Keenihan et al. | |
| 8,361,602 B2 | 1/2013 | Keenihan et al. | |
| 2002/0043277 A1 * | 4/2002 | Yamawaki | E04D 1/30 136/244 |
| 2005/0011550 A1 | 1/2005 | Chittibabu et al. | |
| 2005/0257823 A1 * | 11/2005 | Zwanenburg | B64G 1/443 136/244 |
| 2007/0256734 A1 | 11/2007 | Guha et al. | |
| 2007/0295392 A1 | 12/2007 | Cinnamon | |
| 2007/0295393 A1 | 12/2007 | Cinnamon | |
| 2008/0115822 A1 | 5/2008 | Cunningham et al. | |
| 2008/0190047 A1 | 8/2008 | Allen | |
| 2008/0302030 A1 | 12/2008 | Stancel et al. | |
| 2008/0302031 A1 | 12/2008 | Bressler | |
| 2009/0000222 A1 * | 1/2009 | Kalkanoglu | E04D 1/20 52/173.3 |
| 2009/0044850 A1 * | 2/2009 | Kimberley | F24J 2/045 136/244 |
| 2009/0178350 A1 * | 7/2009 | Kalkanoglu | E04F 13/0864 52/173.3 |
| 2009/0215304 A1 * | 8/2009 | Faust | H01L 31/02008 439/358 |
| 2009/0242015 A1 | 10/2009 | Wattman et al. | |
| 2010/0101624 A1 | 4/2010 | Fioretti et al. | |
| 2010/0146878 A1 * | 6/2010 | Koch | H01L 31/05 52/173.3 |
| 2011/0036494 A1 * | 2/2011 | Keenihan | B29C 67/0044 156/285 |
| 2011/0094570 A1 * | 4/2011 | Boven | H01L 31/0481 136/252 |
| 2011/0100436 A1 | 5/2011 | Cleereman et al. | |
| 2011/0183540 A1 | 7/2011 | Keenihan et al. | |
| 2011/0220183 A1 | 9/2011 | Mills et al. | |
| 2012/0082604 A1 | 4/2012 | Liu et al. | |
| 2012/0082608 A1 | 4/2012 | Waki et al. | |
| 2012/0103478 A1 | 5/2012 | Johnson et al. | |
| 2012/0118361 A1 | 5/2012 | Keenihan et al. | |

FOREIGN PATENT DOCUMENTS

| | | | |
|---|---|---|---|
| EP | 1744372 A2 | 1/2007 | |
| EP | 1923920 A1 | 5/2008 | |
| JP | 2143468 | 6/1990 | |
| JP | 2216874 | 8/1990 | |
| JP | 10189924 A | 7/1998 | |
| JP | 11-40835 | 2/1999 | |
| JP | 2000/501469 A | 2/2000 | |
| JP | 2000/174312 A | 6/2000 | |
| JP | 2013/544648 A | 12/2013 | |
| WO | 2007/035677 A2 | 3/2007 | |
| WO | 2008/137966 A2 | 11/2008 | |
| WO | 2008/137966 A3 | 11/2008 | |
| WO | 2008/139102 | 11/2008 | |
| WO | 2008/155786 A1 | 12/2008 | |
| WO | 2009/121062 A1 | 10/2009 | |
| WO | 2009/137347 A2 | 11/2009 | |
| WO | 2009/137352 | 11/2009 | |
| WO | 2009/137352 A2 | 11/2009 | |
| WO | WO 2009137348 A2 * | 11/2009 | H01R 31/00 |
| WO | WO 2009137353 A2 * | 11/2009 | H01R 31/00 |
| WO | 2011/112759 A2 | 9/2011 | |
| WO | 2012/082604 A2 | 6/2012 | |

OTHER PUBLICATIONS

The State Intellectual Property Office of the People's Republic of China dated Feb. 2, 2015 for Application No. 201180061081.0.

Search Report & Written Opinion dated Oct. 4, 2012 (PCT/US11/64393).

International Preliminary Report on Patentability (PCT/US11/64393).

* cited by examiner

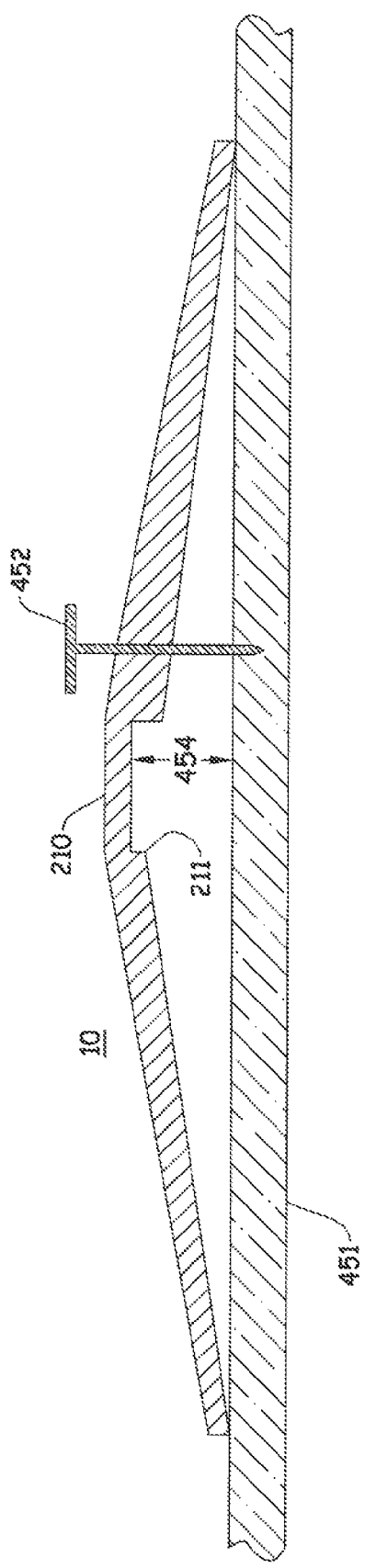

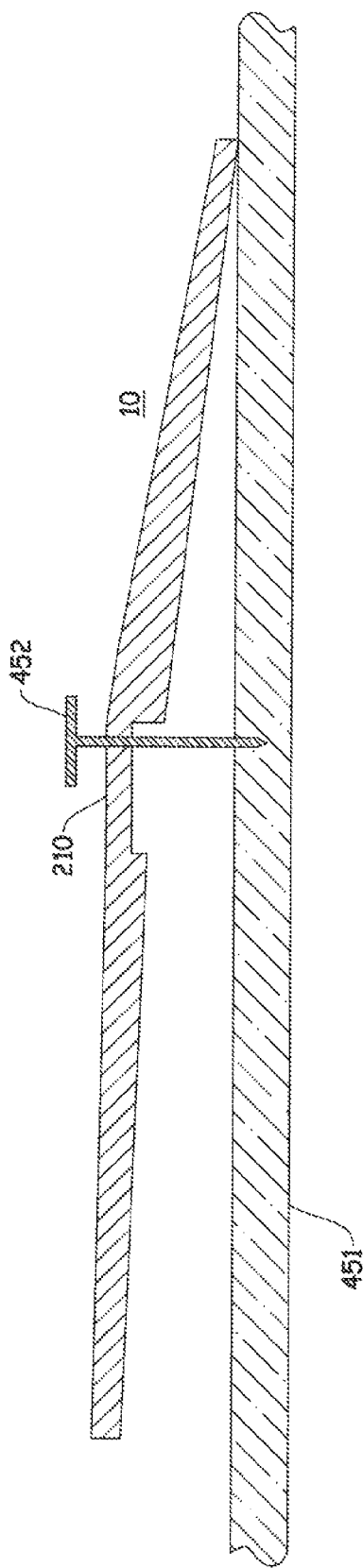

US 9,602,046 B2

PHOTOVOLTAIC DEVICE

CLAIM OF PRIORITY

The present application claims the benefit of the filing date of U.S. Provisional Application No. 61/424,325 filed on Dec. 17, 2010 the contents of which are hereby incorporated by reference in their entirety.

This invention was made with U.S. Government support under contract DE-FC36-07G017054 awarded by the Department of Energy. The U.S. Government has certain rights in this invention.

FIELD OF THE INVENTION

The present invention relates to an improved photovoltaic device ("PVD" or "PV device"), more particularly to an improved photovoltaic device with a multilayered photovoltaic cell assembly in the form of a panel and a body portion joined at an interface region including at least one interconnecting member, at least one interconnecting structural member, relieving feature, unique component geometry, or any combination thereof.

BACKGROUND

Efforts to improve PV devices, particularly those devices that are integrated into building structures (e.g. roofing shingles or exterior wall coverings), to be used successfully, should satisfy a number of criteria. The PV device should be durable (e.g. long lasting, sealed against moisture and other environmental conditions) and protected from mechanical abuse over the desired lifetime of the product, preferably at least 10 years, more preferably at least 25 years. The device should be easily installed (e.g. installation similar to conventional roofing shingles or exterior wall coverings) or replaced (e.g. if damaged). It may be desirable to choose materials and components, along with design features that aid in meeting the desired durability requirements such as being free of deformations that would impair performance (for example as published in United Laboratories UL 1703 Standard—ISBN 0-7629-0760-6 and or Temperature Cycling Test pursuant to IEC16646).

To make this full package desirable to the consumer, and to gain wide acceptance in the marketplace, the system should be inexpensive to build and install. This may help facilitate lower generated cost of energy, making PV technology more competitive relative to other means of generating electricity.

Existing art systems for PV devices may allow for the device to be directly mounted to the building structure or they may fasten the devices to battens, channels or "rails" ("stand-offs")) above the building exterior (e.g. roof deck or exterior cladding). These systems may be complicated, typically do not install like conventional cladding materials (e.g. roofing shingles or siding) and, as a consequence, may be expensive to install. Also, they may not be visually appealing as they do not look like conventional building materials. "Stand-offs" to mount PV device every 2-4 feet may be required. Thus, installation cost can be as much or more as the cost of the article. They also may suffer from issues related to environmental conditions such as warping, fading and degradation of its physical properties.

Among the literature that can pertain to this technology include the following patent documents: US20080190047 (A1); U.S. Pat. Nos. 4,321,416; 5,575,861; 5,437,735; 5,990,414; 6,840,799; EP1744372; U.S. Pat. Nos. 6,875,914; 5,590,495; 5,986,203; US2008/0115822; EP1923920; U.S. Pat. No. 7,365,266; US20070295393 A1; US20070295392 A1; WO 2008/139102; WO 2009/137348; WO 2009/137347; WO 2009/137352; WO 2009/137353; and U.S. Provisional 61/233,527, all incorporated herein by reference for all purposes.

SUMMARY OF THE INVENTION

The present invention is directed to a PV device that addresses at least one or more of the issues described in the above paragraphs.

Accordingly, pursuant to one aspect of the present invention, there is contemplated a photovoltaic device that includes at least: a three-dimensional multi-layered photovoltaic cell assembly in the form of a panel with at least a top surface, a bottom surface, and a peripheral edge, further including a barrier layer; a body portion, wherein the body portion is at least partially surrounding a portion of the top surface and peripheral edge of the three-dimensional multi-layered photovoltaic cell assembly; and at least one relieving feature disposed in the panel or in the body portion adapted to allow elastic deformation of the photovoltaic device over a temperature range.

The invention may be further characterized by one or any combination of the features described herein, such as the three-dimensional multi-layered photovoltaic cell assembly includes at least one electrical connector assembly with a connector housing, the housing having an outer surface; the three-dimensional multi-layered photovoltaic cell assembly includes two electrical connector assemblies disposed on opposite sides of the assembly; the plurality of relieving features are disposed in the body portion at least partially between the barrier layer and the housing of the two electrical connector assemblies; the relieving features are disposed within 15.0 mm of the barrier layer of the three-dimensional multi-layered photovoltaic cell assembly along at least 50 percent of a top peripheral edge; the relieving features are disposed within 5.0 mm of a top peripheral edge of the connector housing; the relieving feature comprises a barrier layer divided in at least two pieces with at least a relieving elastomeric barrier between each piece; the relieving feature comprises at least a partial thinning of the body portion between a corner of the connector housing and a rounded barrier perimeter corner; the relieving feature comprises a localized thinning of the body portion, wherein the localized thinning has a depth of at least 50 percent that of a depth of the three-dimensional multi-layered photovoltaic cell assembly; the relieving feature includes an elastomeric filling material; the barrier layer is comprised of a glass with a thickness of 1.0 to 5.0 mm; at least one interconnecting structural member; at least the body portion is comprised of: a body material with a body CLTE, the body portion with a body lower surface portion, body upper surface portion and a body side surface portion spanning between the upper and lower surface portions and forming a body peripheral edge, wherein at least a portion of the body portion abuts to a segment of the barrier layer peripheral edge at an interface region; (A) the segment of the barrier layer peripheral edge that abuts the portion of the body portion has rounded barrier perimeter corners within the segment and/or (B) the device further includes at least one component of the electrical connector assembly at least partially embedded in the body side surface portion and the connector assembly component includes a connector assembly lower surface portion, a connector assembly upper surface portion and a connector assembly side surface portion spanning between the upper and lower surface portions which forms a connector assembly peripheral edge, wherein the connector assembly peripheral edge that is closest to the interface region has at least one rounded connector corner, and the connector assembly is in electrical communication with the photovoltaic cell layer; the multilayered photovoltaic cell assembly is comprised of: at least a barrier layer with a barrier CLTE and a photovoltaic cell layer disposed inboard of a barrier layer peripheral edge, the barrier layer including a barrier lower surface portion, a barrier upper surface portion and a barrier side surface portion spanning between the upper and lower surface portions with a barrier profile between the upper and lower surface portions and a barrier perimeter spanning about the barrier layer which forms the barrier layer peripheral edge; the body portion comprised of: a body material with a body CLTE, the body portion with a body lower surface portion, body upper surface portion and a body side surface portion spanning between the upper and lower surface portions and forming a body peripheral edge, wherein at least a portion of the body portion abuts to a segment of the barrier layer peripheral edge at an interface region; the body portion includes a bending region that has a thickness ("TBR") of about 2.5 mm to 4.0 mm, further wherein the bending region that has a starting point away from the interface region by a distance defined by greater than or equal to a Constant X'*(body CLTE/barrier CLTE)+a Constant C', wherein X' ranges from 1.0 to 5.0 and C' ranges from 1.0 to 5.0; an intermediate layer comprised of a layer material and including a layer elastic modulus value, a layer ultimate elongation value, a layer coefficient of thermal expansion value and a layer strength value, wherein the intermediate layer is at least partially disposed between the three-dimensional multi-layered photovoltaic cell assembly and the body portion assembly.

It should be appreciated that the above referenced aspects and examples are non-limiting, as others exist within the present invention, as shown and described herein.

DESCRIPTION OF THE DRAWINGS

FIG. 24 is a side view showing an illustrative desirable cant.

FIG. 25 is a side view showing an illustrative un-desirable cant.

DETAILED DESCRIPTION OF THE PREFERRED EMBODIMENT

Figure 1:
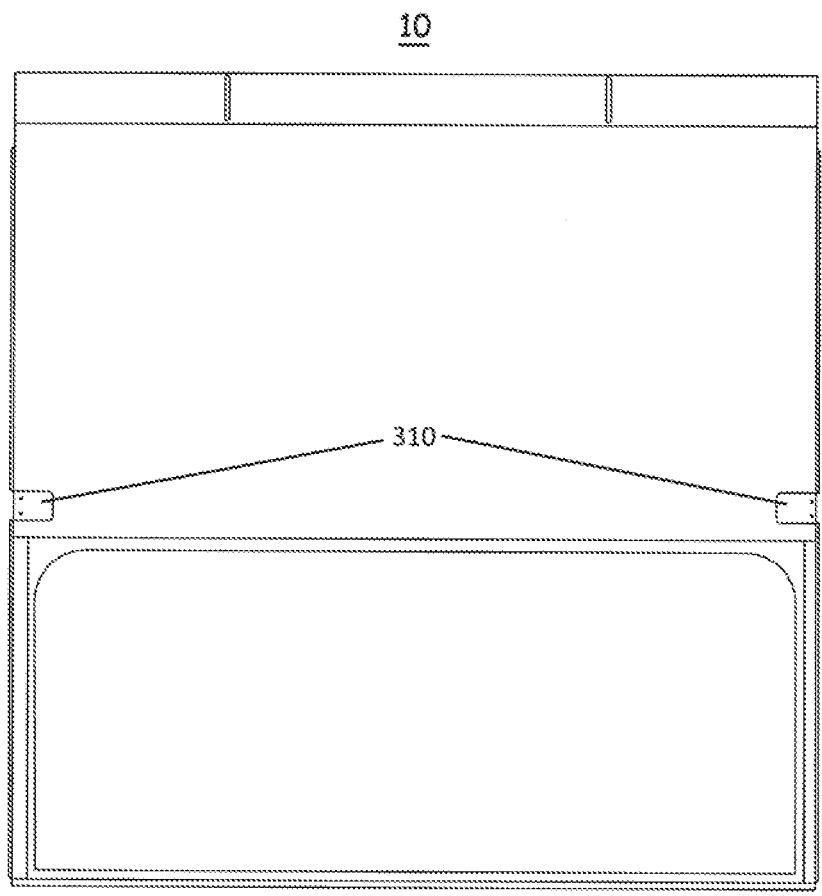
FIG. 1 is a plan view of an illustrative PV device according to the present invention.

The present invention relates to an improved photovoltaic device 10 (hereafter "PV device"), as illustrated in FIG. 1, can be described generally as an assembly of a number of components and component assemblies that functions to provide electrical energy when subjected to solar radiation (e.g. sunlight). Of particular interest and the main focus of the present disclosure is an improved PV device 10 that includes at least a multilayered photovoltaic cell assembly 100 (hereafter "MPCA") joined to a body portion 200. In a preferred embodiment, the PV device is formed by taking the MPCA (and potentially other components and assemblies such as connector components) and forming (e.g. via injection molding) the body portion about at least portions the MPCA. It is contemplated that the relationships (e.g. at least the geometric properties and the material properties) between the components and component assemblies are surprisingly important in solving one or more of the issues discussed in the background section above. Of particular interest in this invention is where the PV device 10 is utilized for what is commonly known as Building-Integrated Photovoltaics, or BIPV. Each of the components and component assemblies and their relationships are disclosed in greater detail and specificity in the following paragraphs.

Multilayered Photovoltaic Cell Assembly (MPCA) 100

Figure 2A:
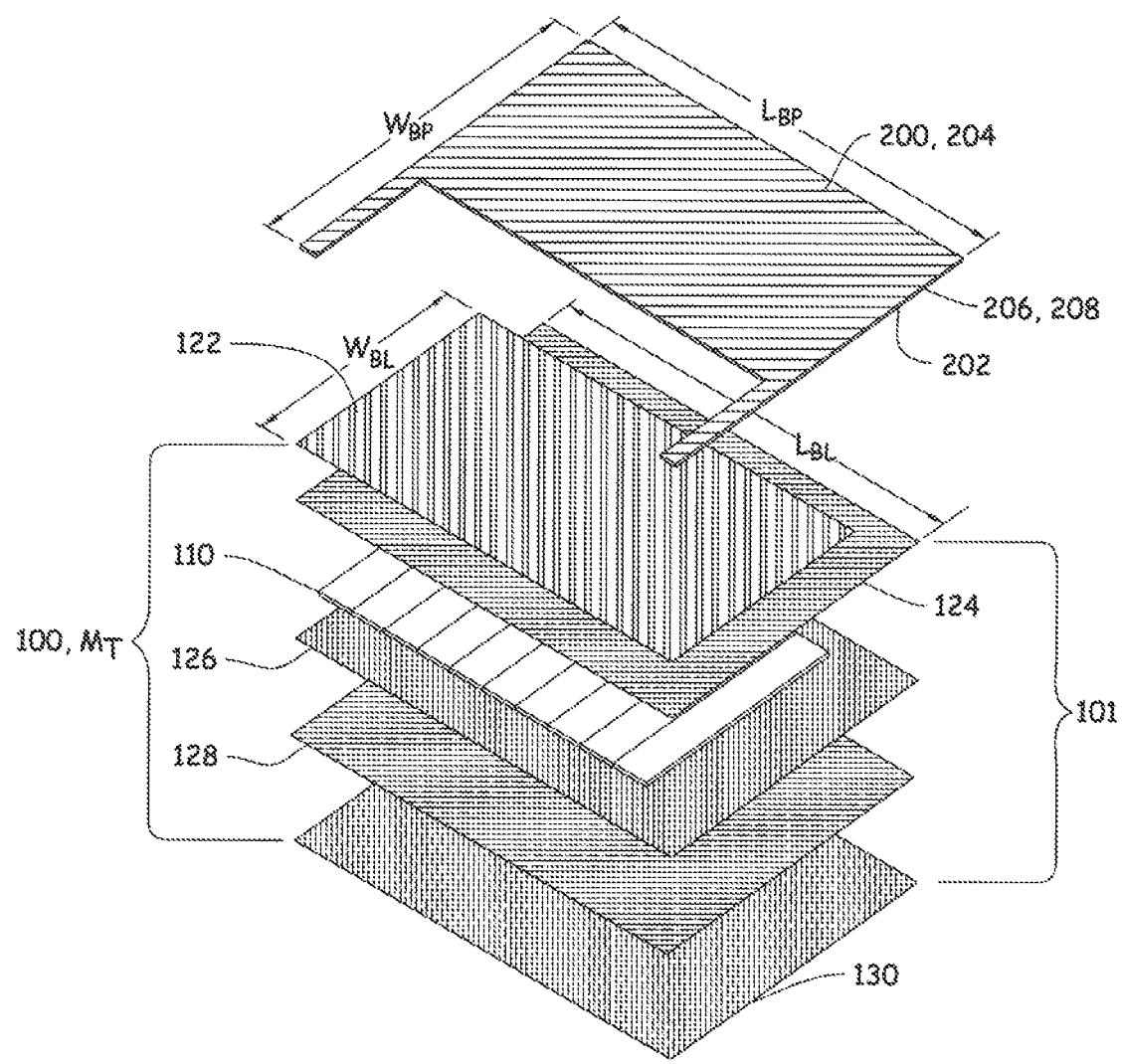
FIG. 2A is a perspective and exploded view of an illustrative PV device according to the present invention.
Figure 2B:
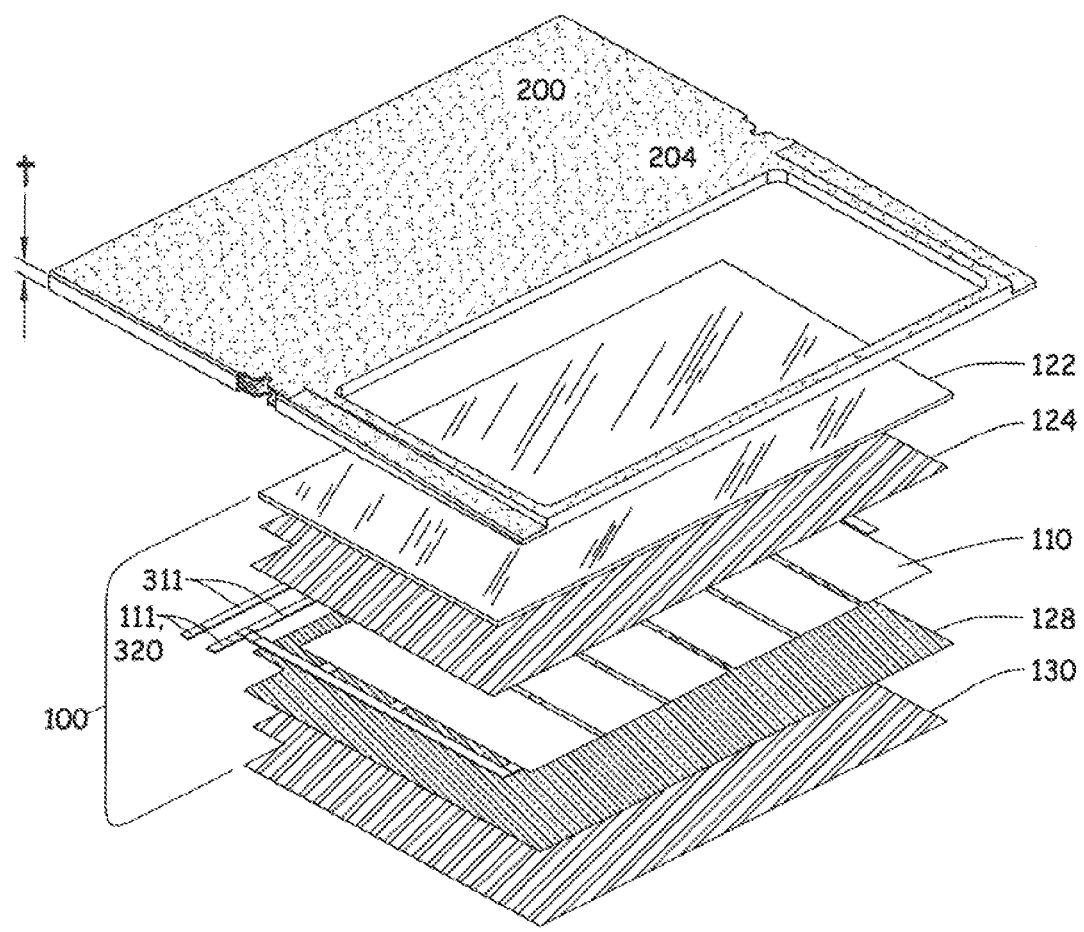
FIG. 2B is a perspective and exploded view of another illustrative PV device according to the present invention.

It is contemplated that the MPCA 100 may be a compilation of numerous layers and components/assemblies, for example as disclosed in currently pending International patent application No. PCT/US09/042,496, incorporated herein by reference. The MPCA contains at least a barrier layer 122 and a photovoltaic cell layer 110 (generally located inboard of the peripheral edge of the barrier layer 122). It is contemplated that the MPCA 100 may also contain other layers, such as encapsulant layers and other protective layers. Illustrative examples are shown in the figures and are discussed below. Exploded views of exemplary MPCAs 100 are shown in FIGS. 2A and 2B. It is contemplated that the overall MPCA 100 thickness $M_T$ may be about 1 to 12 mm, preferably about 2 to 9 mm, and most preferably less than about 9.0 mm.

Functionally, these encapsulant layers and other protective layers may include a number of distinct layers that each serve to protect and/or connect the MCPA 100 together. Each preferred layer is described in further detail below, moving from the "top" (e.g. the layer most exposed to the elements) to the "bottom" (e.g. the layer most closely contacting the building or structure). In general each preferred layer or sheet may be a single layer or may itself comprise sub layers.

Barrier Layer 122

The barrier layer 122 may function as an environmental shield for the MPCA 100 generally, and more particularly as an environmental shield for at least a portion of the photovoltaic cell layer 110. The barrier layer 122 is preferably constructed of a transparent or translucent material that allows light energy to pass through to the photoactive portion of the photovoltaic cell layer 110. This material may be flexible (e.g. a thin polymeric film, a multi-layer film, glass, or glass composite) or be rigid (e.g. a thick glass or Plexiglas such as polycarbonate). The material may also be characterized by being resistant to moisture/particle penetration or build up. The barrier layer 122 may also function to filter certain wavelengths of light such that unpreferred wavelengths may not reach the photovoltaic cells. In a preferred embodiment, the barrier layer 122 material will also range in thickness from about 0.05 mm to 10.0 mm, more preferably from about 0.1 mm to 4.0 mm, and most preferably from 2.5 mm to 3.5 mm. Other physical characteristics, at least in the case of a film, may include: a tensile strength of greater than 20 MPa (as measured by JIS K7127); tensile elongation of 1% or greater (as measured by JIS K7127); and/or a water absorption (23° C., 24 hours) of 0.05% or less (as measured per ASTM D570); and/or a coefficient of linear expansion ("CLTE") of about 5×10-6 mm/mm° C. to 100×10-6 mm/mm° C., more preferably of about 10×10-6 mm/mm° C. to 80×10-6 mm/mm° C., and most preferably from about 20×10-6 mm/mm° C. to 50×10-6 mm/mm° C. Other physical characteristics, at least in the case of a thick glass, may include: a coefficient of linear expansion ("CLTE") of about 5×10-6 mm/mm° C. to about 140×10-6 mm/mm° C., preferably of about 7×10-6 mm/mm° C. to about 50×10-6 mm/mm° C., more preferably from about 8×10-6 mm/mm° C. to about 30×10-6 mm/mm° C., and most preferably from about 9×10-6 mm/mm° C. to about 15×10-6 mm/mm° C. Other physical characteristics, at least in the case of a thick glass, may include: a density of about 2.42 g/cm³ to about 2.52 g/cm³, a tensile strength of between about 75 to 200 N/sq.mm, a compressive strength of between 500 and 1200 N/sq.mm, a modulus of elasticity of between 60-80 GPa, a CLTE of about 9×10-6 mm/mm° C., and a visible light transmission of at least about 85%, preferably about at least 87%, more preferably at least about 90%.

First Encapsulant Layer 124

In one example of an encapsulant layer, a first encapsulant layer 124 may be disposed below the barrier layer 122 and generally above the photovoltaic cell layer 110. It is contemplated that the first encapsulant layer 124 may serve as a bonding mechanism, helping hold the adjacent layers together. It should also allow the transmission of a desirous amount and type of light energy to reach the photovoltaic cell 110. The first encapsulant layer 124 may also function to compensate for irregularities in geometry of the adjoining layers or translated through those layers (e.g. thickness changes). It also may serve to allow flexure and movement between layers due to temperature change and physical movement and bending. In a preferred embodiment, first encapsulant layer 124 may consist essentially of an adhesive film or mesh, preferably an EVA (ethylene-vinyl-acetate), thermoplastic polyolefin, polyurethanes, ionomers, silicon based polymers or similar material. The preferred thickness of this layer range from about 0.1 mm to 1.0 mm, more preferably from about 0.2 mm to 0.8 mm, and most preferably from about 0.25 mm to 0.5 mm.

Photovoltaic Cell Layer 110

The photovoltaic cell layer 110 contemplated in the present invention may be constructed of any number of known photovoltaic cells commercially available or may be selected from some future developed photovoltaic cells. These cells function to translate light energy into electricity. The photoactive portion of the photovoltaic cell is the material which converts light energy to electrical energy. Any material known to provide that function may be used including crystalline silicon, amorphous silicon, CdTe, GaAs, dye-sensitized solar cells (so-called Gratezel cells), organic/polymer solar cells, or any other material that converts sunlight into electricity via the photoelectric effect. However, the photoactive layer is preferably a layer of IB-IIIA-chalcogenide, such as IB-IIIA-selenides, IB-IIIA-sulfides, or IB-IIIA-selenide sulfides. More specific examples include copper indium selenides, copper indium gallium selenides, copper gallium selenides, copper indium sulfides, copper indium gallium sulfides, copper gallium selenides, copper indium sulfide selenides, copper gallium sulfide selenides, and copper indium gallium sulfide selenides (all of which are referred to herein as CIGSS). These can also be represented by the formula CuIn(1−x)GaxSe(2−y)Sy where x is 0 to 1 and y is 0 to 2. The copper indium selenides and copper indium gallium selenides are preferred. Additional electroactive layers such as one or more of emitter (buffer) layers, conductive layers (e.g. transparent conductive layers) and the like as is known in the art to be useful in CIGSS based cells are also contemplated herein. These cells may be flexible or rigid and come in a variety of shapes and sizes, but generally are fragile and subject to environmental degradation. In a preferred embodiment, the photovoltaic cell assembly 110 is a cell that can bend without substantial cracking and/or without significant loss of functionality. Exemplary photovoltaic cells are taught and described in a number of US patents and publications, including U.S. Pat. Nos. 3,767,471, 4,465,575, US20050011550 A1, EP841706 A2, US20070256734 a1, EP1032051A2, JP2216874, JP2143468, and JP10189924a, incorporated hereto by reference for all purposes.

The photovoltaic cell layer 110, for example as illustrated in FIG. 2B, may also include electrical circuitry, such as buss bar(s) 111 that are electrically connected to the cells, the connector assembly component(s) 300 and generally run from side to side of the PV device 10. This area may be known as the buss bar region 311.

Second Encapsulant Layer 126

In another example of an encapsulant layer, a second encapsulant layer 126 is generally connectively located below the photovoltaic cell layer 110, although in some instances, it may directly contact the top layer 122 and/or the first encapsulant layer 124. It is contemplated that the second encapsulant layer 126 may serve a similar function as the first encapsulant layer, although it does not necessarily need to transmit electromagnetic radiation or light energy.

Back Sheet 128

In an example of a protective layer there may be a back sheet 128 which is connectively located below the second encapsulant layer 126. The back sheet 128 may serve as an environmental protection layer (e.g. to keep out moisture and/or particulate matter from the layers above). It is preferably constructed of a flexible material (e.g. a thin polymeric film, a metal foil, a multi-layer film, or a rubber sheet). In a preferred embodiment, the back sheet 128 material may be moisture impermeable and also range in thickness from about 0.05 mm to 10.0 mm, more preferably from about 0.1 mm to 4.0 mm, and most preferably from about 0.2 mm to 0.8 mm. Other physical characteristics may include: elongation at break of about 20% or greater (as measured by ASTM D882); tensile strength or about 25 MPa or greater (as measured by ASTM 0882); and tear strength of about 70 kN/m or greater (as measured with the Graves Method). Examples of preferred materials include: glass plate; aluminum foil; poly (vinyl fluoride) (for example, commercially available as Tedlar® (a trademark of DuPont)); poly (ethylene terephthalate); copolymer of tetrafluoroethylene and hexafluoroethylene (also known as "FEP"); poly (ethylene tetrafluoroethylene); poly (ethylene naphthalate); poly (methyl methacrylate); and polycarbonate, or a combination thereof.

Supplemental Barrier Sheet 130

In another example of a protective layer there may be a supplemental barrier sheet 130 which is connectively located below the back sheet 128. The supplemental barrier sheet 130 may act as a barrier, protecting the layers above from environmental conditions and from physical damage that may be caused by any features of the structure on which the PV device 10 is subjected to (e.g. For example, irregularities in a roof deck, protruding objects or the like). It is contemplated that this is an optional layer and may not be required. It is also contemplated that this layer may serve the same functions as the body portion 200. In a preferred embodiment, the supplemental barrier sheet 130 material may be at least partially moisture impermeable and also range in thickness from about 0.25 mm to 10.0 mm, more preferably from about 0.5 mm to 2.0 mm, and most preferably from 0.8 mm to 1.2 mm. It is preferred that this layer exhibit elongation at break of about 20% or greater (as measured by ASTM D882); tensile strength or about 10 MPa or greater (as measured by ASTM D882); and tear strength of about 35 kN/m or greater (as measured with the Graves Method). Examples of preferred materials include thermoplastic polyolefin ("TPO"), thermoplastic elastomer, olefin block copolymers ("OBC"), natural rubbers, synthetic rubbers, polyvinyl chloride, and other elastomeric and plastomeric materials. Alternately the protective layer could be comprised of more rigid materials so as to provide additional roofing function under structural and environmental (e.g. wind) loadings. Additional rigidity may also be desirable so as to improve the coefficient of thermal expansion of the PV device 10 and maintain the desired dimensions during temperature fluctuations. Examples of protective layer materials for structural properties include polymeric materials such polyolefins, polyesters, polyamides, polyimides, polyester amides, polysulfone, acetal, acrylic, polyvinyl chloride, nylon, polycarbonate, phenolic, polyetheretherketone, polyethylene terephthalate, epoxies, including glass and mineral filled composites or any combination thereof.

The above described layers may be configured or stacked in a number of combinations, but it is preferred that the barrier layer 122 is the top layer. Additionally, it is contemplated that these layers may be integrally joined together via any number of methods, including but not limited to: adhesive joining; heat or vibration welding; over-molding; or mechanical fasteners.

For the sake of clarity in view of some of the embodiments discussed below, the MPCA 100 can be further described in another fashion, as a two part assembly. The first part, the MPCA subassembly 101, comprising all the layers of the MPCA 100 (with the exception of the barrier layer 122) and the second part being the barrier layer 122. The barrier layer 122 may also be described as having a length "$L_{BL}$" and a width "$W_{BL}$", for example as labeled in FIG. 2A. Preferably, the $L_{BL}$ ranges from about 0.75 to about 1.25 times that of the $L_{BP}$ discussed below, more preferably the lengths are within about 5-10% of each other. Also contemplated is that the MPCA subassembly 101 may have an overall CLTE ("subassembly CLTE") that ranges from about 30×10-6 mm/mm° C. to 150×10-6 mm/mm° C., more preferably about 50×10-6 mm/mm° C. to 100×10-6 mm/mm° C.

Body Portion 200

It is contemplated that the body portion 200 may be a compilation of components/assemblies, but is preferably generally a polymeric article that is formed by injecting a polymer (or polymer blend) into a mold (with or without inserts such as the MPCA 100 or the other component(s) (e.g. connector component)—discussed later in the application), for example as disclosed in currently pending International patent application No. PCT/US09/042,496, incorporated herein by reference. The body portion 200 functions as the main structural carrier for the PV device 10 and should be constructed in a manner consistent with this. For example, it can essentially function as a plastic framing material. It is contemplated that the body portion 200 should adhere to MPCA 100 with an adhesion strength no less than the stress due to thermal expansion.

It is contemplated that the compositions that make up the body portion 200 also exhibit a coefficient of linear thermal expansion ("CLTE") of about 0.5×10-6 mm/mm° C. to about 140×10-6 mm/mm° C., preferably of about 3×10-6 mm/mm° C. to about 50×10-6 mm/mm° C., more preferably from about 5×10-6 mm/mm° C. to about 30×10-6 mm/mm° C., and most preferably from about 7×10-6 mm/mm° C. to about 15×10-6 mm/mm° C. Most desirably, the CLTE of the composition that makes up the body portion 200 should closely match the CLTE of the barrier layer 122. Preferably the CLTE of the composition making up the body portion 200 disclosed herein are also characterized by a coefficient of linear thermal expansion (CLTE) is within factor of 20, more preferably within a factor of 15, still more preferably within a factor of 10, even more preferably within a factor of 5, and most preferably within a factor of 2 of the CLTE of the barrier layer 122. For example, if the barrier layer 122 has a CLTE of 9×10-6 mm/mm° C., then the CLTE of the molding composition is preferably between 180×10-6 mm/mm° C. and 0.45×10-6 mm/mm° C. (a factor of 20);

more preferably between 135×10-6 mm/mm° C. and 0.6×10-6 mm/mm° C. (a factor of 15); still more preferably between 90×10-6 mm/mm° C. and 0.9×10-6 mm/mm° C. (a factor of 10); even more preferably between 45×10-6 mm/mm° C. and 1.8×10-6 mm/mm° C. (a factor of 5) and most preferably between 18×10-6 mm/mm° C. and 4.5×10-6 mm/mm° C. (a factor of 2). Matching the CLTE's between the composition comprising the body portion 200 and the barrier layer 122 is important for minimizing thermally-induced stresses on the BIPV device during temperature changes, which can potentially result in cracking, breaking of PV cells, etc.

For some embodiments of the photovoltaic articles disclosed herein, the barrier layer 122 includes a glass barrier layer. If the barrier layer 122 includes a glass layer, the CLTE of the molding composition is preferably less than 80×10-6 mm/mm° C., more preferably less than 70×10-6 mm/mm° C., still more preferably less than 50×10-6 mm/mm° C., and most preferably less than 30×10-6 mm/mm° C. Preferably, the CLTE of the novel composition is greater than 5×10-6 mm/mm° C.

When glass is used (as the barrier layer 122), the compositions of the body material preferably have an elongation at break of at least 3% but not typically more than 200%. It is also contemplated, when glass is not used, that the body material preferably has an elongation at break of at least 100%, more preferably at least 200%, more preferably still at least 300% and preferably no more than 500%. The tensile elongation at break of compositions were determined by test method ASTM D638-08 (2008) @ 23° C. using a test speed of 50 mm/min.

In a preferred embodiment, the body support portion 200 may comprise (be substantially constructed from) a body material. This body material may be a filled or unfilled moldable plastic (e.g. polyolefins, acrylonitrile butadiene styrene (SAN), hydrogenated styrene butadiene rubbers, polyesters, polyamides, polyester amides, polyether imide, polyimides, polysulfone, acetal, acrylic, polyvinyl chloride, nylon, polyethylene terephthalate, polycarbonate, thermoplastic and thermoset polyurethanes, synthetic and natural rubbers, epoxies, SAN, Acrylic, polystyrene, or any combination thereof). Fillers (preferably up to about 50% by weight) may include one or more of the following: colorants, fire retardant (FR) or ignition resistant (IR) materials, reinforcing materials, such as glass or mineral fibers, surface modifiers. Plastic may also include anti-oxidants, release agents, blowing agents, and other common plastic additives. In a preferred embodiment, glass fiber filler is used. The glass fiber preferably has a fiber length (after molding) ranging from about 0.1 mm to about 2.5 mm with an average glass length ranging from about 0.7 mm to 1.2 mm.

In a preferred embodiment, the body material (composition(s)) has a melt flow rate of at least 5 g/10 minutes, more preferably at least 10 g/10 minutes. The melt flow rate is preferably less than 100 g/10 minutes, more preferably less than 50 g/10 minutes and most preferably less than 30 g/10 minutes. The melt flow rate of compositions were determined by test method ASTM D1238-04, "REV C Standard Test Method for Melt Flow Rates of Thermoplastics by Extrusion Plastometer", 2004 Condition L (230° C./2.16 Kg). Polypropylene resins used in this application also use this same test method and condition. The melt flow rate of polyethylene and ethylene—α-olefin copolymers in this invention are measured using Condition E (190° C./2.16 Kg), commonly referred to as the melt index.

In all embodiments, the compositions have flexural modulus of at least 200 MPa, more preferably at least 400 MPa and most preferably at least 700 MPa. According to the preferred embodiment where the MPCA 100 includes a glass layer, the flexural modulus is preferably at least 1000 and no greater than 7000 MPa. According to the second embodiment, the flexural modulus is no greater than 1500 MPa, more preferably no greater than 1200 MPa, most preferably no greater than 1000 MPa. The flexural modulus of compositions were determined by test method ASTM D790-07 (2007) using a test speed of 2 mm/min. It is contemplated that the compositions that make up the body portion 200 also exhibit a coefficient of linear thermal expansion ("body CLTE") of about 25×10-6 mm/mm° C. to 70×10-6 mm/mm° C., more preferably of about 27×10-6 mm/mm° C. to 60×10-6 mm/mm° C., and most preferably from about 30×10-6 mm/mm° C. to 40×10-6 mm/mm° C.

Preferably, the novel compositions are characterized as having an RTI Electrical and an RTI Mechanical Strength, each of which is at least 85° C., preferably at least 90° C., more preferably at least 95° C., still more preferably at least 100° C., and most preferably at least 105° C.

RTI (Relative Thermal Index) is determined by the test procedure detailed in UL 746B (Nov. 29, 2000). Essentially a key characteristic of the plastic is measured at the start of the test (for instance tensile strength), and then samples placed in at least four elevated temperatures (e.g. 130, 140, 150, 160 deg C.) and samples periodically tested throughout several months. The reductions in key properties are then tested, and working criteria established from comparison results of known materials of proven field service. The effective lifetime of the unknown, sample is then determined compared to the known material. RTI is expressed in degrees C. The test takes a minimum of 5000 hours to complete, and can be both time-consuming and costly.

Because RTI is an expensive and time-consuming test, a useful proxy for guiding the skilled artisan in selecting useful compositions is the melting point, as determined by differential scanning calorimetry (DSC). It is preferred that for the compositions set forth as useful herein, no melting point is seen at temperatures less than 160° C. in differential scanning calorimetry for a significant portion of the composition and preferably no melting point is seen under 160° C. for the entire composition. The Differential Scanning calorimetry profiles were determined by test method ASTM D7426-08 (2008) with a heating rate of 10° C./min. If a significant fraction of the injection molding composition melts at temperatures below 160° C., it is unlikely that the composition will pass the UL RTI tests 746B for Electrical, Mechanical Strength, Flammability, and Mechanical Impact with a high enough rating to adequately function when used in the PV device 10 (particularly when uses as a BIPV).

It is contemplated that the body portion 200 may be any number of shapes and sizes. For example, it may be square, rectangular, triangular, oval, circular or any combination thereof. The body portion 200 may also be described as having a length "$L_{BP}$" and a width "$W_{BP}$", for example as labeled in FIG. 2A and may be as little as 10 cm and as much as 500 cm or more, respectively. It may also have a thickness (t) that may range from as little as about 1 mm to as much as 20 mm or more and may vary in different area of the body portion 200. Preferably, the body portion 200 can be described as having a body lower surface portion 202, body upper surface portion 204 and a body side surface portion 206 spanning between the upper and lower surface portions and forming a body peripheral edge 208.

Connector Assembly

Figure 3:
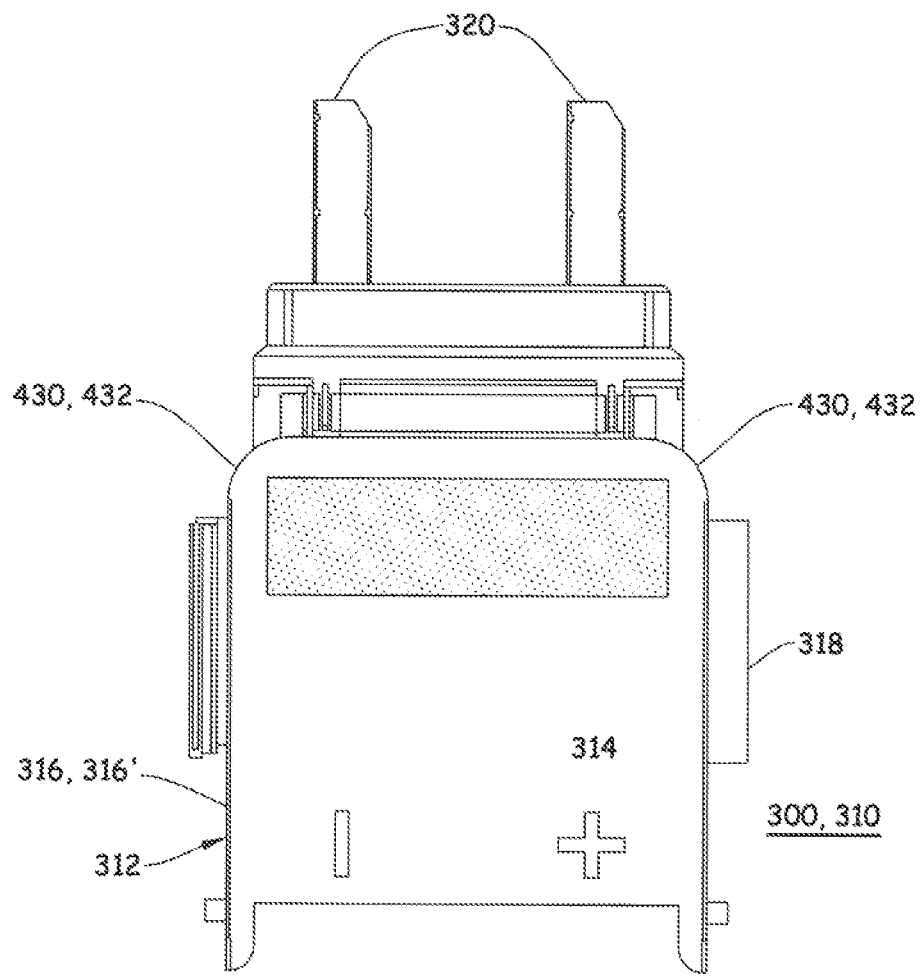
FIG. 3 is a plan view of an illustrative connector housing according to the present invention.

The connector assembly functions to allow for electrical communication to and/or from the PV device 10. This communication may be in conjunction with circuitry connected to the photovoltaic cell layer 110 or may just facilitate communication through and across the PV device 10 via other circuitry. The connector assembly may be constructed of various components and assemblies, and the main focus of this invention relates to the connector assembly component(s) 300 that are integral to (embedded within) the PV device. Generally, as illustrated in FIG. 3, this component 300 comprises a polymeric housing 310 and electrical leads 320 protruding into the PV device 10, although other configurations are contemplated. Examples of preferred materials that make up the housing 310 include: Polymeric compounds or blends of PBT (Polybutylene Terephthalate), PPO (Polypropylene Oxide), PPE (Polyphenylene ether), PPS (Polyphenylene sulfide), PA (Poly Amid) and PEI (polyether imide) and these can be with or without fillers of up to 65% by weight. It is contemplated that the compositions that make up the housing 310 also exhibit a coefficient of linear thermal expansion ("CLTE") in the flow direction of about $12 \times 10\text{-}6$ mm/mm° C. to $100 \times 10\text{-}6$ mm/mm° C., more preferably of about $15 \times 10\text{-}6$ mm/mm° C. to $80 \times 10\text{-}6$ mm/mm° C., and most preferably from about $20 \times 10\text{-}6$ mm/mm° C. to $60 \times 10\text{-}6$ mm/mm° C.

It is contemplated that the housing 310 may be constructed of any number of materials (as shown above), but preferably with material characteristics such as: a tensile modulus that is at least about 0.1 GPa, more preferably about 1 GPa, and most preferably about 10 GPa or more; ultimate elongation value of about 1 percent, more preferably about 1.5 percent, and most preferably about 2.5 percent or more; coefficient of linear thermal expansion value of about $50 \times 10\text{-}6$ mm/mm° C., more preferably about $30 \times 10\text{-}6$ mm/mm° C., and most preferably about $20 \times 10\text{-}6$ mm/mm° C.

In this illustrative connector housing 310, the housing may be further defined as having a connector assembly lower surface portion 312, a connector assembly upper surface portion 314 and a connector assembly side surface portion 316 that spans between the upper and lower surface portions. The side surface portion 316 forming a connector assembly peripheral edge 316'. Also located on the side surface portion 316 may be flanges or projections 318.

In one embodiment, it is contemplated that the connector may also include a latching feature (not shown) which may function to positively latch a male and female connector portions together when installed. This may be a preferred configuration in the case where the intermediate layer 500, interconnecting structural member 1500, relieving feature 2500, or any combination thereof are disposed about the connector housing 310.

It is also contemplated that the "connector assembly" or "connector housing 310" described above could be some other component or object that is located in the same place in the PV device 10. The relationships discussed in the following sections also apply to this other component or object.

Intermediate Layer 500

Intermediate layer or layers may be provided in the device 10. The intermediate layer may function to aid in controlling stress/strain due to the CLTE mismatch between the MPCA 100, the body portion and/or the connector housing 310. It also may have the added benefit of aiding in the overall dimensional stability of the device, particularly in relation to the movement of the connector housing 310 over a desired temperature range (e.g. about −40° C. to 90° C.). Additionally, it may exhibit moisture barrier properties, such as water vapor transmission rate of preferably no greater than 50 g/m²-day at 38° C. In the case wherein the device 10 includes a relatively ridged polygonal barrier layer 122 and at least one housing 310, it may function as a bridge between the two components.

It is contemplated that the intermediate layer 500 may comprise (be substantially constructed from) an intermediate layer material. This intermediate layer material preferably may be selected from a group consisting of materials such as butyl rubber, ionomers, silicone rubber, polyurethane elastomers, polyolefin elastomers can serve this purpose or composites thereof. In one preferred embodiment, the layer material is formed from an encapsulant layer, the encapsulant as described above.

In one embodiment, where the layer 500 is designed to substantially absorb stresses, it is contemplated that the intermediate layer 500 may be constructed of any number of materials (as shown above), but preferably with material characteristics such as: an tensile modulus that is less than about 300 MPa, more preferably less than about 50 MPa, and most preferably about 1 MPa or less; ultimate elongation value of about 200 percent, more preferably about 500 percent, and most preferably about 1200 percent or more.

In another embodiment, where the layer 500 may both absorb and transfer the stresses, it is contemplated that the intermediate layer 500 may be a material with an elastic (tensile or Young's) modulus that is at least within (plus or minus) about 15 percent of an elastic (tensile or Young's) modulus of any of (or all of) the body portion 200, the MPCA 100, and the connector housing 310, more preferably about 10 percent, and most preferably about 5 percent. In a preferred embodiment, the layer elastic (tensile or Young's) modulus that is at least 5 percent less than that the body portion elastic (tensile or Young's) modulus or the cell elastic (tensile or Young's) modulus. It is also contemplated, that in a preferred embodiment, the layer material has a layer ultimate elongation value at least 100 percent more than a body portion ultimate elongation value, a cell ultimate elongation value, or both. It is also contemplated, that in a preferred embodiment, the layer material has a layer yield strength value at least 5 percent lower than a body portion yield strength value and a cell yield strength value. In an alternative way of defining the layer 500, it may preferably be characterized as have a Young's modulus value ranging from about 50 to 5000 MPa, more preferably from about 100 to 700 MPa, and most preferably from about 150 to 400 MPa.

It is contemplated that the intermediate layer 500 may be a separate component that is disposed between the MPCA 100 and the at least one connector 300 or may surround portions of the connector 300 and/or the top layer 122. The layer 500 may also be integral to the MPCA 100. Illustrative examples are provided below.

Interconnecting Structural Member 1500

Interconnecting structural member or members may be provided in the device 10. The interconnecting structural member 1500 may function to aid in controlling stress/strain due to the CLTE mismatch between the MPCA 100, the body portion and/or the connector housing 310. It also may have the added benefit of aiding in the overall dimensional stability of the device, particularly in relation to the movement of the connector housing 310 over a desired temperature range (e.g. about −40° C. to 90° C.). In the case wherein the device 10 includes a relatively ridged barrier layer 122 and at least one housing 310, it may function as a bridge between the two components.

It is contemplated that the structural member 1500 may be constructed of any number of materials, but preferably constructed of a material with a tensile modulus that is at least about 1.25× that of a tensile modulus of the body portion, more preferably about 1.5×, and most preferably about 2× or more. For example, using an inorganic material (such as a steel reinforcement member that may have a modulus of about 206 GPa) this range could be up to 200×. It is also contemplated that the interconnecting structural member may be a material with a tensile modulus that is virtually equivalent to a tensile modulus of the top layer or as much as about 4× thereof. In one preferred embodiment, the structural member 1500 tensile modulus is at least within about 5 to 30 percent of a tensile modulus of the top layer 122, more preferably about 7 to 20 percent, and most preferably about 10 to 15 percent. In a preferred embodiment, the interconnecting structural member 1500 may comprise (be substantially constructed from) an interconnecting structural member material. The interconnecting structural member material preferably may be selected from a group consisting of glass, metals, ceramics, aluminum, steel, carbon fiber, filled and unfilled polymers, or composites thereof.

It is contemplated that the structural member 1500 may be integrated in the body, or may be a separate component that is disposed between the MPCA 100 and the at least one connector 300 or may be integral to the connector 300. The structural member 1500 may be used anywhere localized strain exist to minimize the strain. (e.g. not only between the MPCA 100 and a connector) It is also contemplated that the structural member 1500 may include locating features that may aid in the positioning of itself or additional components of the device 10.

Geometric and Material Property Relationships

It is believed that the choices of materials used in the construction of the PV device 10 and its constituent components and both the geometric and physical property relationships have an effect on overall performance of the system (e.g. durability and ease of assembly of multiple PV devices together). Balancing the needs of ease of manufacture, costs and/or product performance requirements may drive unique material choices and component design (e.g. the use of at least one interconnecting member described below; the use of at least one interconnecting structural member described below; and/or relieving feature(s) 2500 therein). The present invention contemplates these factors and provides a unique solution to achieve a desired result.

It is contemplated that it may be desirous to match physical properties as much as feasible of the various components such that the complete system can work in harmony (e.g. all or most components constructed from similar materials or material families). Where this cannot be achieved fully, it is contemplated that unique geometric design features/components (e.g. interconnecting members; interconnecting structural members; relieving features, and/or geometric designs of individual components) may be needed. Of particular interest is the relationship of choice of material properties of the body portion 200, the MPCA 100 as a whole (and in some case particularly the barrier layer 122), and the connector 300, and the geometric relationship to each other.

MPCA, Body, and/or Connector Relationships

This section concentrates on certain aspects of the relationships between the MPCA 100, the body portion 200, and/or the connector housing 310 and interconnecting intermediate layer(s) 500 therein. The intermediate layer may be disposed in the panel or in the body portion adapted to allow controlled elastic deformation of the photovoltaic device 10 over a temperature range (typically near to or just below the outer surface of the body portion 200). Typically, the temperature range is from about −40° C. to 90° C. It is believed that this deformation is due in large part to the CLTE differences between the body portion 200 (and the connector, when present) and the MPCA 100. In other words, the intermediate layer provides a mechanism for dissipating and/or directing stresses caused by the CLTE differences. It is also contemplated that the smaller the CLTE differences between the respective components, the smaller (e.g. dimensionally) or fewer areas where the intermediate layer (s) 500 may be required. For example, when the CLTE differences between the respective components are greater than 5 percent, it is believed that at least one area of intermediate layering is required.

This section also concentrates on certain aspects of the relationships between the MPCA 100, the body portion 200, and/or the connector housing 310 and interconnecting structural member(s) 1500 therein. The interconnecting structural member disposed in the panel or in the body portion adapted to allow controlled elastic deformation of the photovoltaic device 10 over a temperature range (typically near to or just below the outer surface of the body portion 200). Typically, the temperature range is from about −40° C. to 90° C. It is believed that this deformation is due in large part to the CLTE differences between the body portion 200 (and the connector, when present) and the MPCA 100. In other words, the interconnecting structural member provides a mechanism for dissipating and/or directing stresses caused by the CLTE differences.

This section concentrates on certain aspects of the relationships between the MPCA 100, MPCA subassembly 101 and the body portion 200. Several illustrative examples and preferred embodiments are detailed herein. One skilled in the art should realize that these examples should not be limiting and the present invention contemplates other potential configurations.

Figure 21:
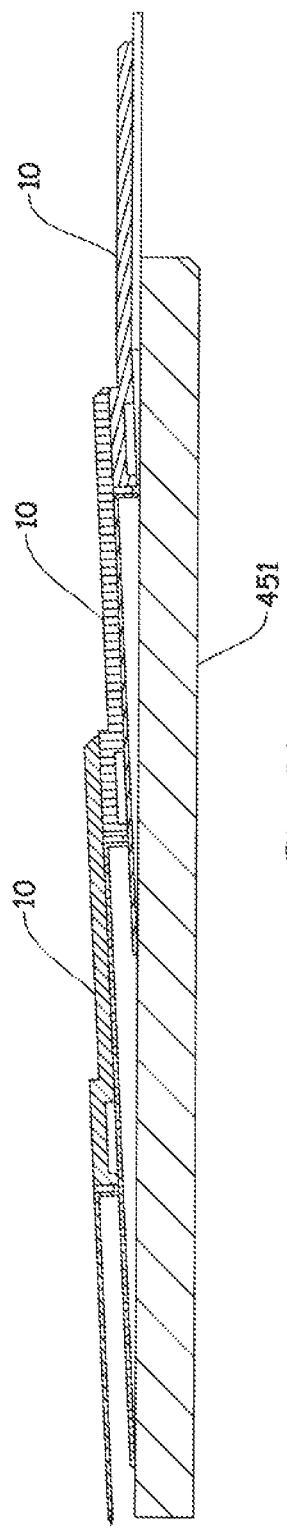
FIG. 21 is a side view of several PV devices on a building structure.

It is believed that it may be desirous to control the overall shape of the PV device 10, particularly to control the cant (or cupping) of the body portion 200 along its width $W_{BP}$. Cupping or cant may be an important consideration when one PV device 10 is laid on (or installed over) another PV device 10 on a surface (e.g. a build structure 451), as illustrated in FIGS. 21, 24 and 25.

FIG. 25 is an illustrative example of a PV device 10 that is not cupped and would not be desirous. FIG. 24 shows a PV device 10 that is cupped in a desirable fashion. The amount of cupping 454 (e.g. distance from the plane of the next lower structure 451 or another PV device 10—cupping value) preferably ranges from about 3.0 mm to about 30 mm, more preferably from about 5.0 mm to 25.0 mm, and most preferably from about 7.0 mm to 15 mm.

It is believed that to effectuate manufacturing a PV device 10 that meets the some or all of the needs discussed above, additional design considerations may be necessary. The present invention contemplates that given the material and geometric relationships discussed in the previous section, it may be beneficial to include a bending region 210. Of particular note is that as the percent difference in the subassembly CLTE to that of the body portion material increase, the need for the bending region increase. These ratios and their influence on component stresses are significant in isolation of stress loadings. It may be advantageous to locate these regions in such a way that manufacturing and installation loadings do not combine with stresses due to thermal loadings and the relative CLTE's of the materials. This may also occur at a critical region of the device that includes critical electrical components (connector, bus bars, etc.) that influence the part to disadvantaged thicknesses and lengths. Examples of the location and/or the configuration of the bending region 210 are presented below. It is contemplated that any or all combinations of aspects from each example may be combined if so desired.

It is preferred that this bending region be located very near (e.g. within about 25.0 mm) the fastening location (or fastening zone 450) of the device 10, such that when it is fastened (e.g. with mechanical fasteners such as nails 452, screws or the like) to the mounting surface (e.g. building structure 451) that the uppermost and lowermost edges are in full contact with the mounting surface or the other devices. It is believed that this maybe important for many aspects of a roofing device and a photovoltaic device. Examples include water sealability, resistance to wind loading, stability in wind and vibration, and maintaining a uniform position on the mounting surface through environmental and servicing situations. It is therefore very desirous to have a bending region such that edges are properly pre-loaded to meet these needs. Without the bending region, excessive force may be needed to fasten the device to the mounting structure. Alternately, if the part has insufficient bending resistance or improper bend (or cant), sufficient edge contact cannot be maintained.

In the case where at least one connector 300 is present in the device 10, the relationship of material properties between of the connector housing 310 and the rest of the respective components are contemplated. In one preferred embodiment, the layer elastic (tensile or Young's) modulus may be at least about equivalent to, more preferably less than and most preferably about 5 percent less than the frame (body portion) elastic (tensile or Young's) modulus, a connector elastic (tensile or Young's) modulus, or both. It is also contemplated in another preferred embodiment that the layer elastic (tensile or Young's) modulus value can be between the frame (body portion) elastic (tensile or Young's) modulus value and the cell elastic (tensile or Young's) modulus value. In yet another preferred embodiment, the layer coefficient of thermal expansion value is at least equivalent to, more preferably higher than and most preferably about 10 percent higher than the frame (body portion) coefficient of thermal expansion value and the connector coefficient of thermal expansion value. In yet another preferred embodiment, the layer ultimate elongation value at least about 50 percent more than, more preferably about 80 percent, and most preferably about 100 percent more than the body portion ultimate elongation value, the connector ultimate elongation value, or both.

It is contemplated that the layer material adheres to the various components that it comes into contact with, with a preferred minimum adhesion value of at least about 0.5 joules/m$^2$, more preferably about 1 joules/m$^2$, and most preferably about 2 joules/m$^2$ as adhered to the three-dimensional multi-layered photovoltaic cell assembly, the body portion or the connector housing. It is also contemplated that it may be desirous that the layer material have a greater adhesion (e.g. 5 percent or greater) to one component versus another component. For example, it may be preferred that the material of the intermediate layer adheres to the connector housing more than to the frame (body portion) assembly and/or adheres to the photovoltaic cell assembly more than to the frame (body portion) assembly. It is contemplated that that adhesion to the components, other than the frame assembly (body portion) may be preferred due to the importance of having a lower water vapor penetration to the electrical components in the device 10.

It is also contemplated that the smaller the CLTE differences between the respective components, the smaller (e.g. dimensionally) or fewer numbers of interconnecting structural member(s) 1500 may be required. For example, when the CLTE differences between the respective components is greater than 5 percent, it is believed that at least one interconnecting structural member and/or at least one relieving feature is required.

Figure 9A:
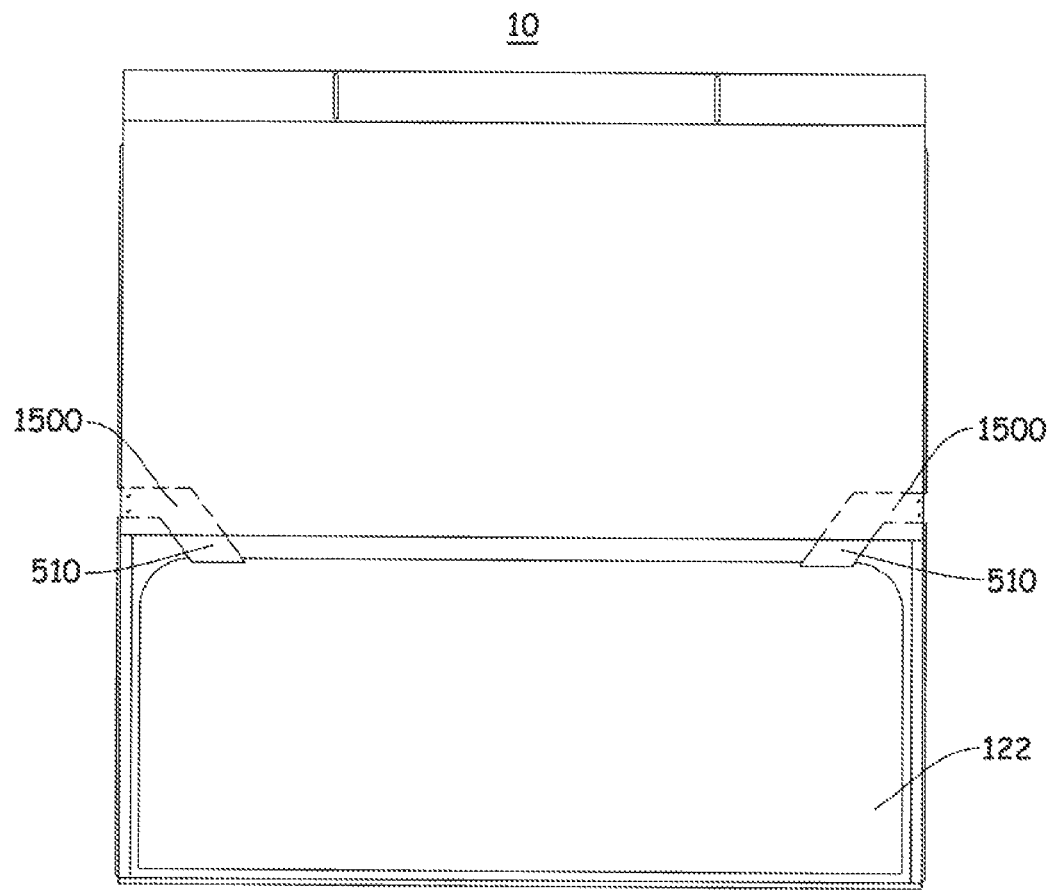
FIG. 9A is a plan view of an illustrative PV device showing another exemplary position of an interconnecting structural member.
Figure 9B:
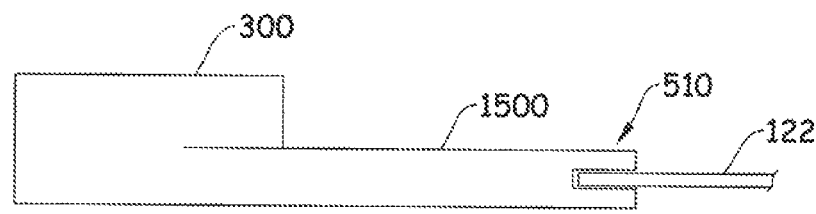
FIG. 9B is a sectional view of 9A through the connector and showing the interface to the layer 122.

It is contemplated that the structural member 1500 may be directly mechanically interlocked (for example as shown in FIG. 9B) into the device 10, may be interlocked via an adhesive system, or a combination thereof. In the case of an adhesive system, the adhesive chosen should have characteristics such as having a tensile yield strength greater than a tensile yield strength of the connector 300 and a tensile yield strength of the body 200. Other desired characteristics may include an adhesive system, the adhesive chosen to have an adhesion strength no less than the stress due to thermal expansion. It is contemplated that the joint between the components, where the adhesive is disposed, should be at least a single or double lap joint, or any such joint that is designed to minimize interfacial stresses.

Several illustrative examples and preferred embodiments are detailed herein. One skilled in the art should realize that these examples should not be limiting and the present invention contemplates other potential configurations.

Figure 4A:
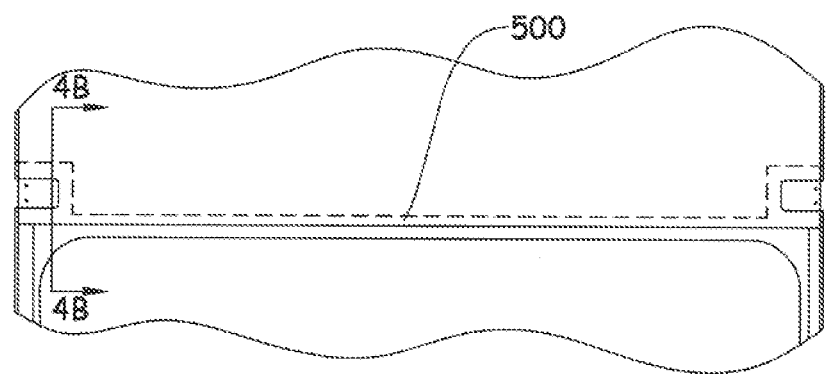
FIG. 4A is a partial plan view of an illustrative PV device showing an exemplary position of an interconnecting member.
Figure 4B:
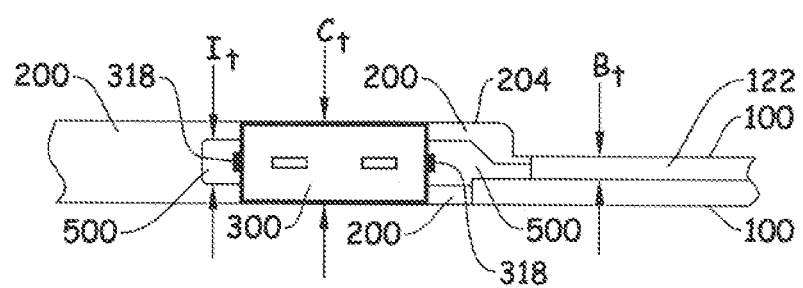
FIG. 4B is a sectional view of FIG. 4A.

In a first example of an intermediate layer 500, as shown in FIGS. 4A-B, the intermediate layer 500 is disposed between the outer surface 204 of the body portion 200 and MPCA 100 and extends around the connector 300 and to the edge of the barrier layer 122. Preferably the layer 500 has a thickness $I_t$ of at least in the immediate vicinity (e.g. within about 5.0 mm) of the connector 300 and the layer 122 of at least about 50 percent of their respective thicknesses ($C_t$, $B_t$).

Figure 5A:
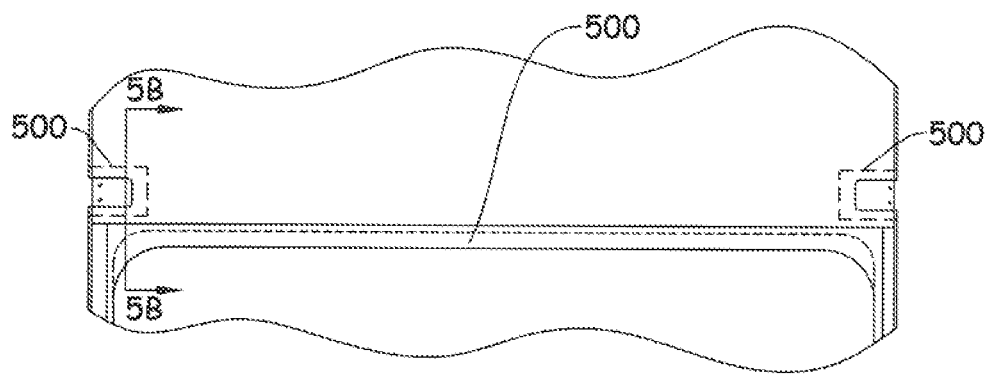
FIG. 5A is a partial plan view of an illustrative PV device showing another exemplary position of an interconnecting member.
Figure 5B:
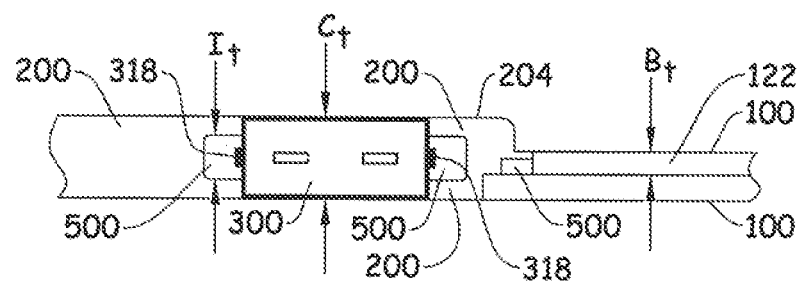
FIG. 5B is a sectional view of FIG. 5A.

In a second example, as shown in FIGS. 5A-B, a first intermediate layer portion 500 is disposed between the outer surface 204 of the body portion 200 and MPCA 100 about the upper edge of the layer 122. A second and third intermediate layer portion 500 extends around the connector 300. Preferably the layer 500 has a thickness $I_t$ of at least in the immediate vicinity (e.g. within about 5.0 mm) of the connector 300 and the layer 122 of at least about 50 percent of their respective thicknesses ($C_t$, $B_t$).

Figure 6A:
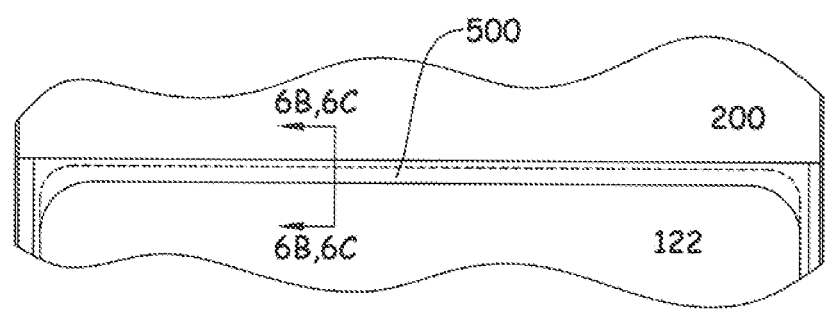
FIG. 6A is a partial plan view of an illustrative PV device showing yet another exemplary position of an interconnecting member.
Figure 6B:
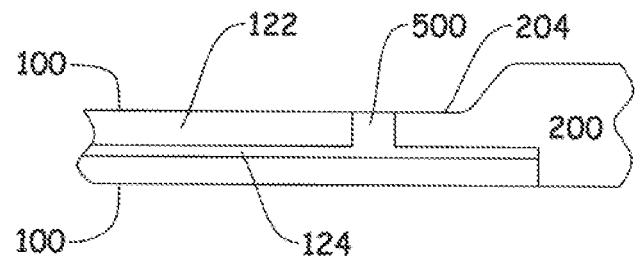
FIG. 6B is an exemplary sectional view of FIG. 6A.
Figure 6C:
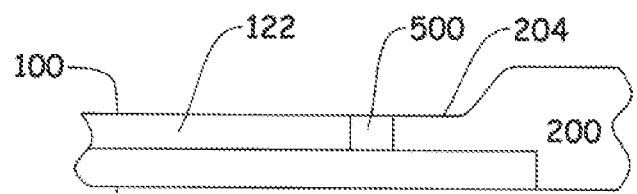
FIG. 6C is another exemplary sectional view of FIG. 6A.

In a third example, as shown in FIGS. 6A-C, a first intermediate layer portion 500 is disposed between the body portion 200 and MPCA 100 about the upper edge of the layer 122 and is coextensive with the body upper surface portion 204. In 6B, the layer portion 500 is shown as being formed from encapsulant layer 124. In 6C, layer 500 is a separate component and/or material from that of layer 124. In this example, the device 10 is shown without the connectors 300; it is contemplated that they may be included if desired.

Figure 7A:
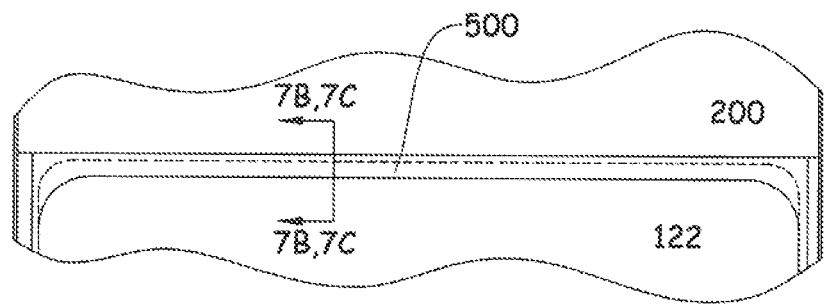
FIG. 7A is a partial plan view of an illustrative PV device showing yet another exemplary position of an interconnecting member.
Figure 7B:
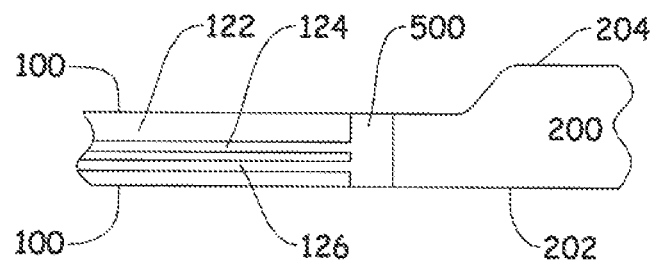
FIG. 7B is an exemplary sectional view of FIG. 7A.
Figure 7C:
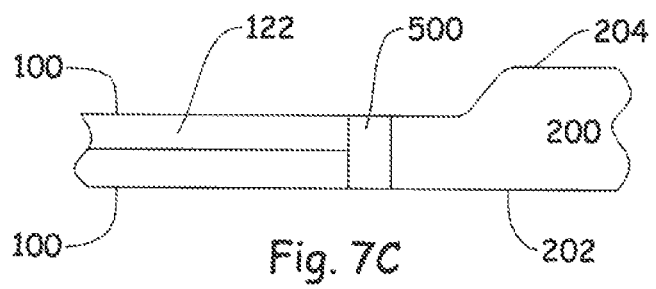
FIG. 7C is another exemplary sectional view of FIG. 7A.

In a fourth example, as shown in FIGS. 7A-C, a first intermediate layer portion 500 is disposed between the body portion 200 and MPCA 100 and completely separates the two components, coextensive with the body lower surface portion 202, and body upper surface portion 204. In 7B, the layer portion 500 is shown as being formed from encapsulant layer 124 and/or 126. In 7C, layer 500 is a separate component and/or material from that of layers 124 and/or 126. In this example, the device 10 is shown without the connectors 300; it is contemplated that they may be included if desired.

Figure 8:
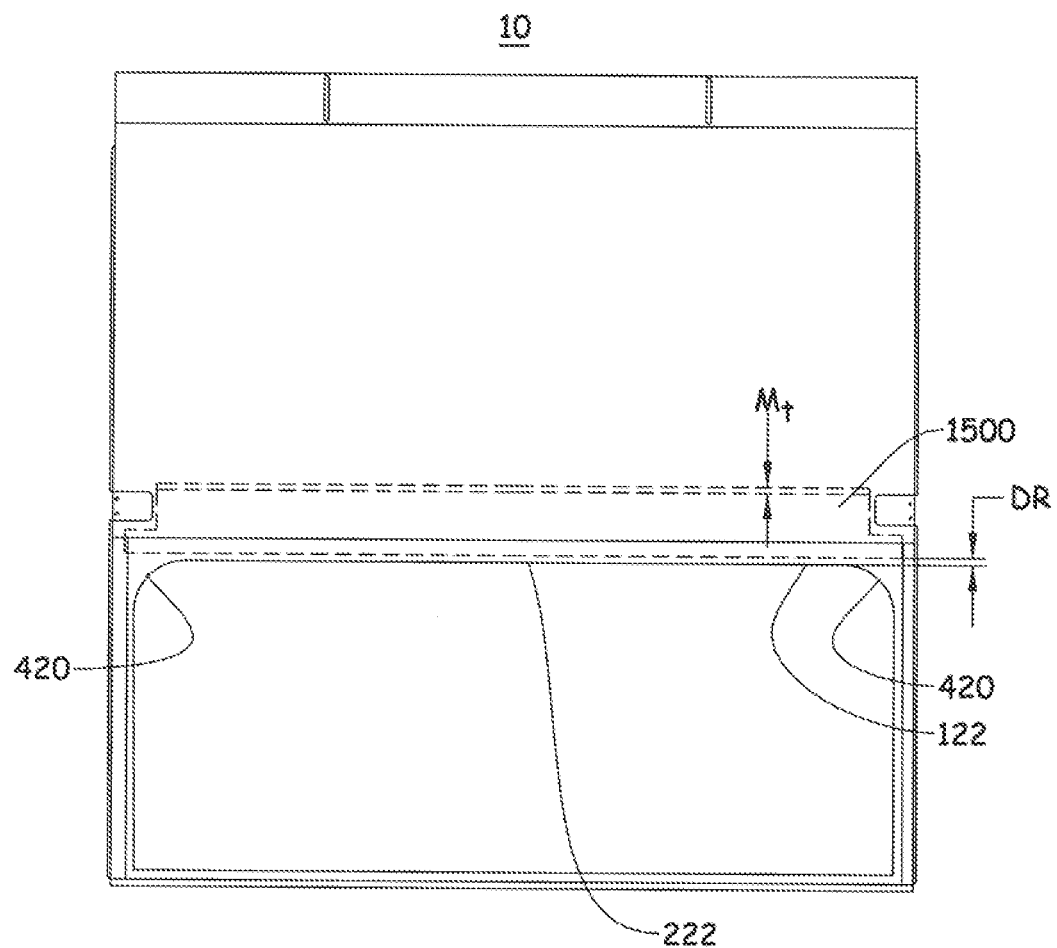
FIG. 8 is a plan view of an illustrative PV device showing an exemplary position of an interconnecting structural member.

In a first illustrative example of a interconnecting structural member 1500, shown in FIG. 8, the body portion 200 and a portion of the barrier layer 122 are joined (e.g. are in contact) along the barrier layer peripheral edge 222. In this example, the barrier layer is comprised of a glass with physical properties for the glass, as disclosed in previous sections of the specification. In this example, the barrier layer peripheral edge 222 has rounded barrier perimeter corners 420. A set of opposing connector housings 310 are disposed along the outer edge of the body portion 200. Also included is a singular interconnecting structural member 1500 disposed in the body portion 200.

In a first preferred embodiment, this interconnecting structural member 1500 is located at least within a distance $D_R$ of the barrier layer of the three-dimensional multi-layered photovoltaic cell assembly along at least about 50 percent (preferably at least about 70 to 90 percent) of the peripheral edge 222 between the corners 420. Preferably, distance $D_R$ is about 0 to 12.0 mm, more preferably about 0.5 mm to 7.0 mm, and most preferably about 1.0 to 5.0 mm. In this illustrative example, the interconnecting structural member 1500 is also disposed along at least one or more sides of the connector housing 310. Preferably, disposed within about 0.5 to 5.0 mm of a peripheral edge of the connector housing, although it is contemplated that it may directly abut the housing 310 (or the peripheral edge 222).

In this embodiment, the interconnecting structural member 1500 is comprised of a plate like structure that has a general thickness $M_T$ of about 1.0 mm to 6.0 mm. It is contemplated that the thickness may be uniform across the structural member 1500, although it may be advantageous for the thickness to be greater in the vicinity of the housing 310 and/or the peripheral edge 222 (e.g. equivalent to or at least about 75 percent the thickness of the housing 310 and/or the peripheral edge 222 respectively).

In a second illustrative example, shown in FIGS. 9A-B, the device 10 is configured similarly to that of the first example, with the exception of the number of and location of the interconnecting structural member 1500. In this illustrative embodiment, there two interconnecting structural members 500. They are integral to the connector housings 310 and project downward to the barrier layer 122. The structural member 1500 includes a locking portion 510 which overlaps the barrier layer on opposing, sides. In this example, it is contemplated that in the area of the locking region 510, an adhesive may be at least partially disposed between the structural member 1500 and the barrier layer 122. Preferably, the locking portion is located on at least two planes so that lateral forces in any direction will not cause it to become dislodged.

Figure 10:
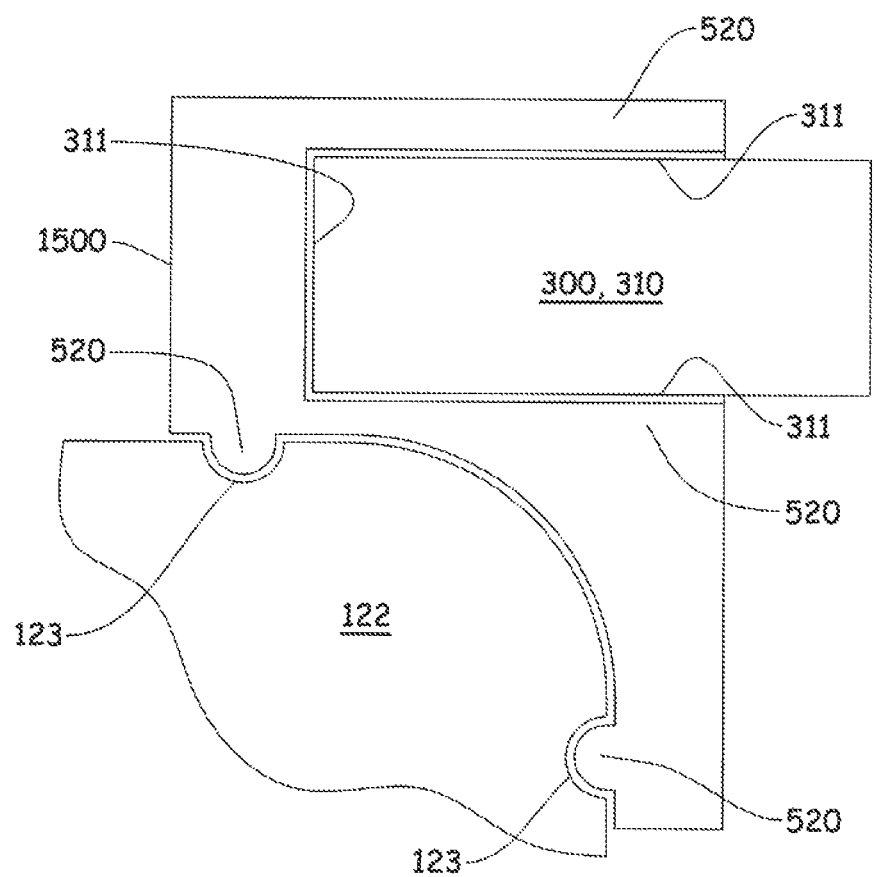
FIG. 10 is a partial plan view of an illustrative PV device showing another exemplary position of an interconnecting structural member.

In a third illustrative example, shown in FIG. 10, the interconnecting structural member is mechanically interlocked with the barrier layer 122 and the connector housing 310. In this embodiment, the interconnecting structural member has locking features 520 that are adapted to mate with a barrier locking feature 123 and a connector locking feature 311. It is contemplated that this may be a line to line fit, a press fit, or have an intermediate adhesive layer disposed in-between. It is contemplated that any number of shapes could be utilized to provide the locking features 520 and the present example is not intended to be limiting.

Figure 12:
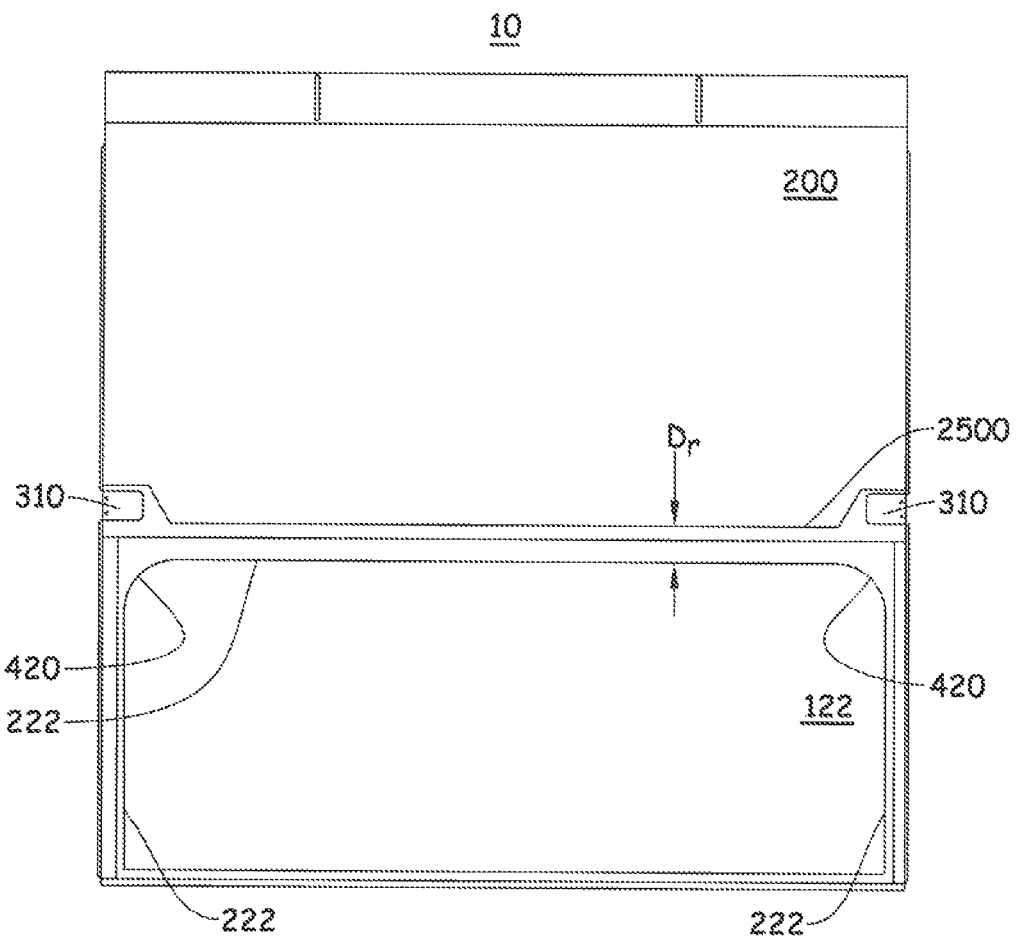
FIG. 12 is a plan view of an illustrative PV device showing an exemplary position of a relieving feature.

In a first illustrative example of a relieving feature 2500, shown in FIG. 12, the body portion 200 and a portion of the barrier layer 122 are joined (e.g. are in contact) along the barrier layer peripheral edge 222. In this example, the barrier layer is comprised of a glass with physical properties for the glass, as disclosed in previous sections of the specification. In this example, the barrier layer peripheral edge 222 has rounded barrier perimeter corners 420. A set of opposing connector housings 310 are disposed along the outer edge of the body portion 200. Also included is a singular relieving feature 2500 disposed in the body portion 200.

In a first preferred embodiment, this relieving feature 2500 is located at least within a distance $D_R$ of the barrier layer of the three-dimensional multi-layered photovoltaic cell assembly along at least about 50 percent (preferably at least about 70 to 90 percent) of the peripheral edge 222 between the corners 420. Preferably, distance $D_R$ is about 10.0 to 30.0 mm, more preferably about 12.5 mm to 25.0 mm, and most preferably about 15.0 to 20.0 mm. In this illustrative example, the relieving feature 2500 is also disposed above the connector housing 310. Preferably, disposed within about 5.0 to 15.0 mm of a top peripheral edge of the connector housing, although it is contemplated that it may directly abut the housing 310.

In this embodiment, the relieving feature is comprised of a localized thinning of the body portion 200. Preferably, the localized thinning has a depth of at least 50 percent that of a depth of the body portion 200 and constitutes a channel 510 with a profile $C_P$ and a width $C_W$. In a preferred embodiment, the width $C_W$ is at least about 1.0 mm and as much as about 15.0 mm, more preferably about 2.5 mm to 12.5 mm, and most preferably about 3.5 to 8.0 mm. It is contemplated that both the location of the relieving feature 2500 and its width $C_W$ can be optimized. Examples shown in FIGS. 11A-F are illustrative and should not be considered as limiting.

Figure 13:
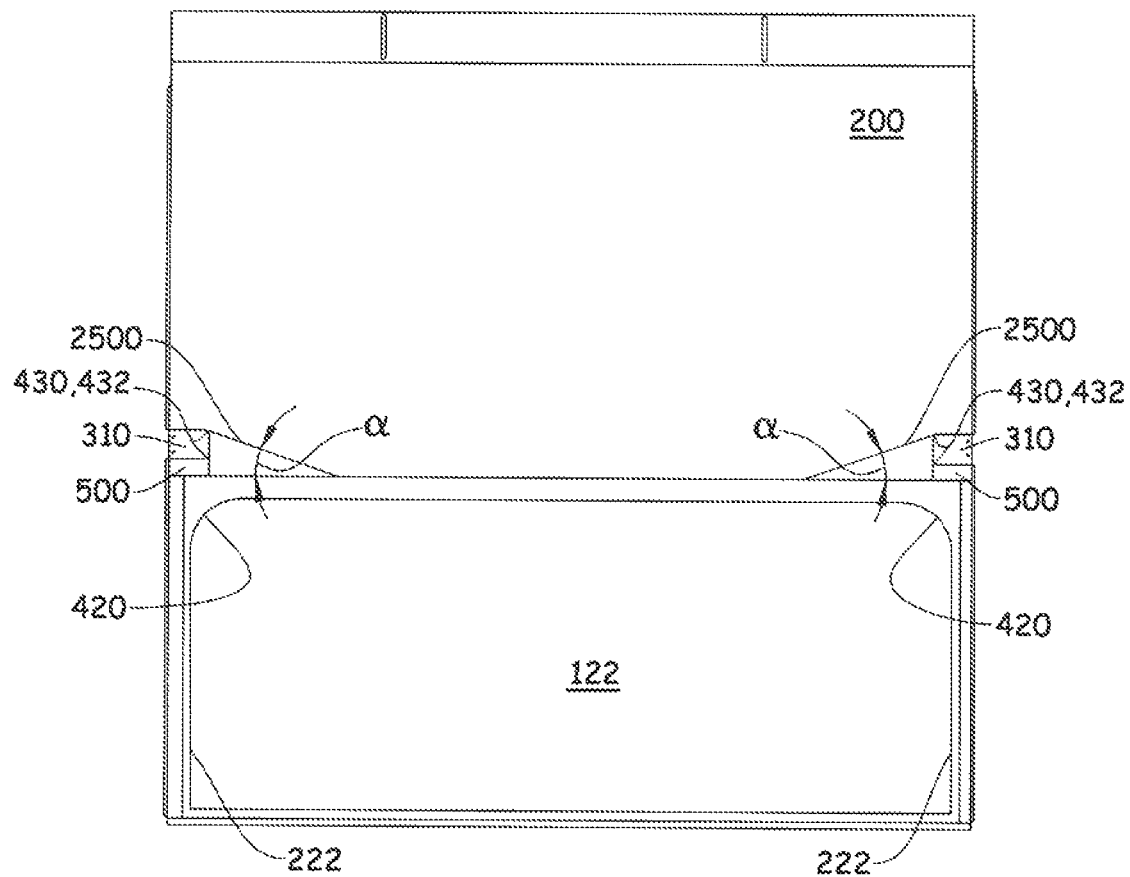
FIG. 13 is a plan view of an illustrative PV device showing other exemplary positions of relieving features.

In a second illustrative example, shown in FIG. 13, the device 10 is configured similarly to that of the first example, with the exception of the number of and location of the relieving feature 2500. In this illustrative embodiment, there are four relieving features 2500. They are disposed in the body portion 200 and span from the inside corners 430, 432 of the connector housings towards the barrier layer 122. In this embodiment, it is preferred that the features 2500 that abut the lower inside corners of the connector housings 310 are directed towards the rounded barrier perimeter corners 420 (somewhere in the curved arc). It is also preferred that the features 2500 that abut the upper inside corners of the connector housings 310 are directed towards the center of the device 10. More preferably at an angle $\alpha$ that has a value between about 15 an 65 degrees, even more preferably between about 30 and 45 degrees. The distal end of the feature (opposite the connector housing 310) is preferably about 10.0 to 30.0 mm from the peripheral edge 222, more preferably about 12.5 mm to 25.0 mm, and most preferably about 15.0 to 20.0 mm.

Figure 11A:
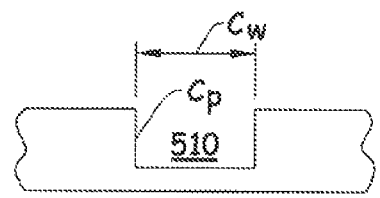
FIGS. 11A-F are sectional views of exemplary relief channels (relieving features) according to the present invention.
Figure 11B:
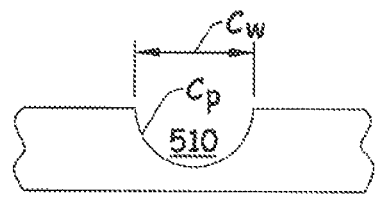
Figure 11C:
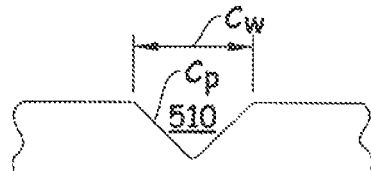
Figure 11D:
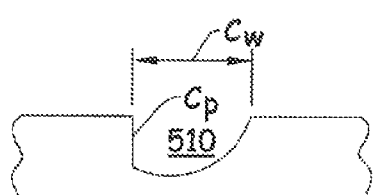
Figure 11E:
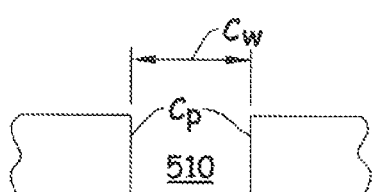
Figure 11F:
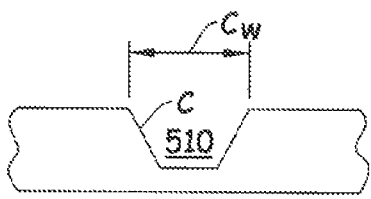
Figure 14:
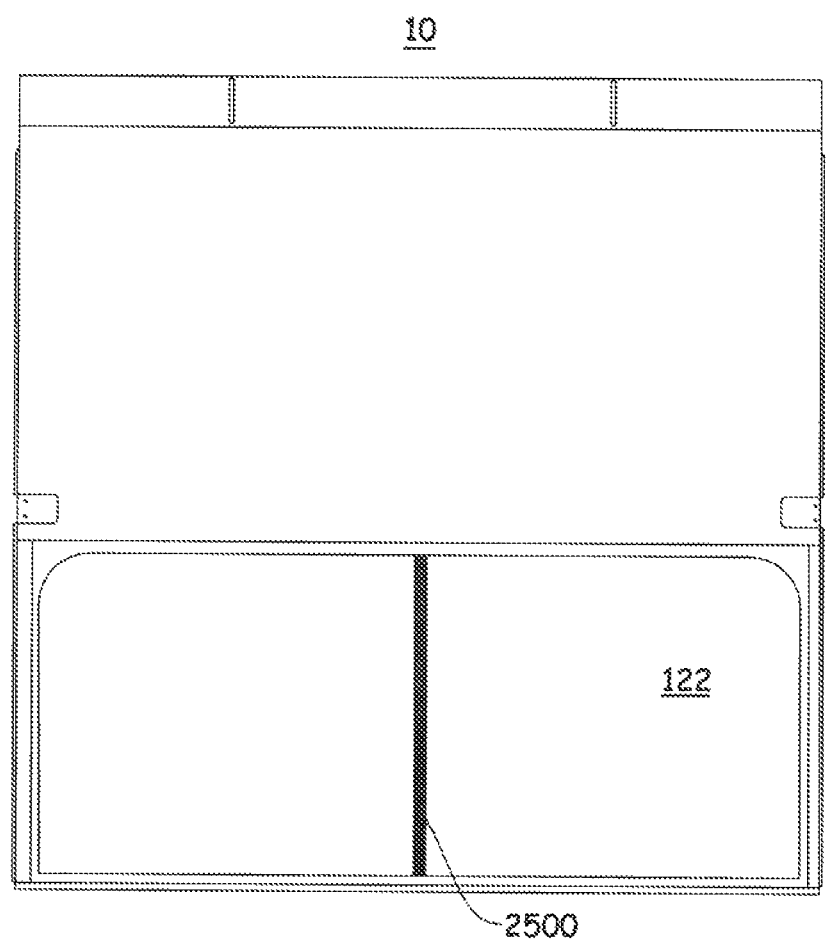
FIG. 14 is a plan view of an illustrative PV device showing an exemplary relieving feature in layer 122.

In a third illustrative example, shown in FIG. 14, the relieving feature is disposed in the barrier layer 122. In this embodiment, the relieving feature has a depth that is at least equivalent to the thickness of the barrier layer 122 and spans across at least 25% of the width $W_{BL}$ (preferably across about 100%). It is also preferable that the channel have a profile similar to that as shown in FIG. 11E. In this embodiment, it is preferable that at least the bottom of the relieving feature channel is filled with an elastomeric barrier material to provide at least some environmental barrier protection (a low modulus, high adhesion and high elongation material). For example, materials such as butyl rubber, ionomers, silicone rubber, polyurethane elastomers, polyolefin elastomers can serve this purpose. The use of such a filler is also contemplated for any of the other embodiments or examples.

Figure 15:
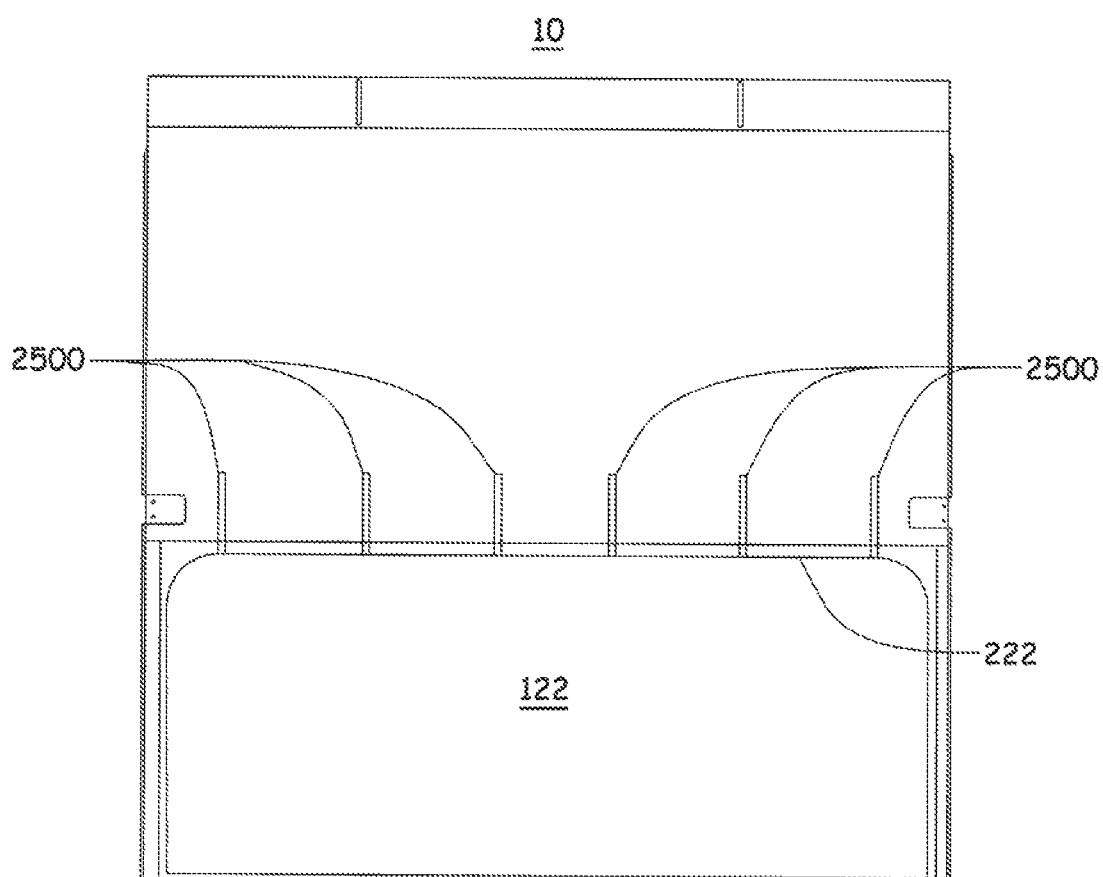
FIG. 15 is a plan view of an illustrative PV device showing other exemplary positions of relieving features.

In a fourth illustrative example, shown in FIG. 15, the device 10 is configured similarly to that of the first example, with the exception of the number of and location of the relieving feature 2500. In this illustrative embodiment, there are six relieving features 2500. They are disposed in the body portion 200 and are channels that run normal to the peripheral edge 222, from the peripheral edge 222 to a point near the top of the connector housing 310. They may be spaced apart about equally across the device 10, but other spacing locations are contemplated.

Figure 16:
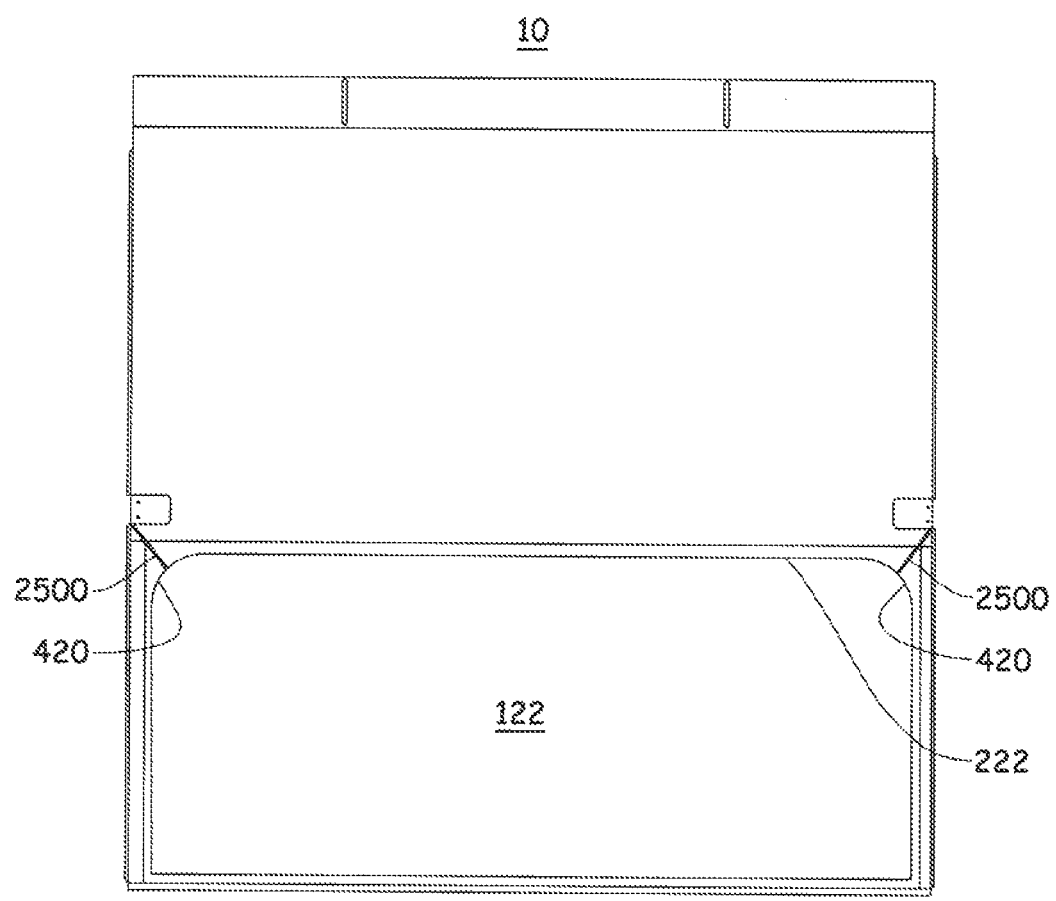
FIG. 16 is a plan view of an illustrative PV device showing other exemplary positions of relieving features.

In a fifth illustrative example, shown in FIG. 16, the device 10 is configured similarly to that of the first example, again with the exception of the number of and location of the relieving feature 2500. In this illustrative embodiment, there are two relieving features 2500. They are disposed in the body portion 200 and are channels that extend from the peripheral edge 222 (preferably in the rounded barrier perimeter corners 420) to a lower outside corner of the connector housing 310 (preferably at the outside periphery of the device 10).

Figure 17:
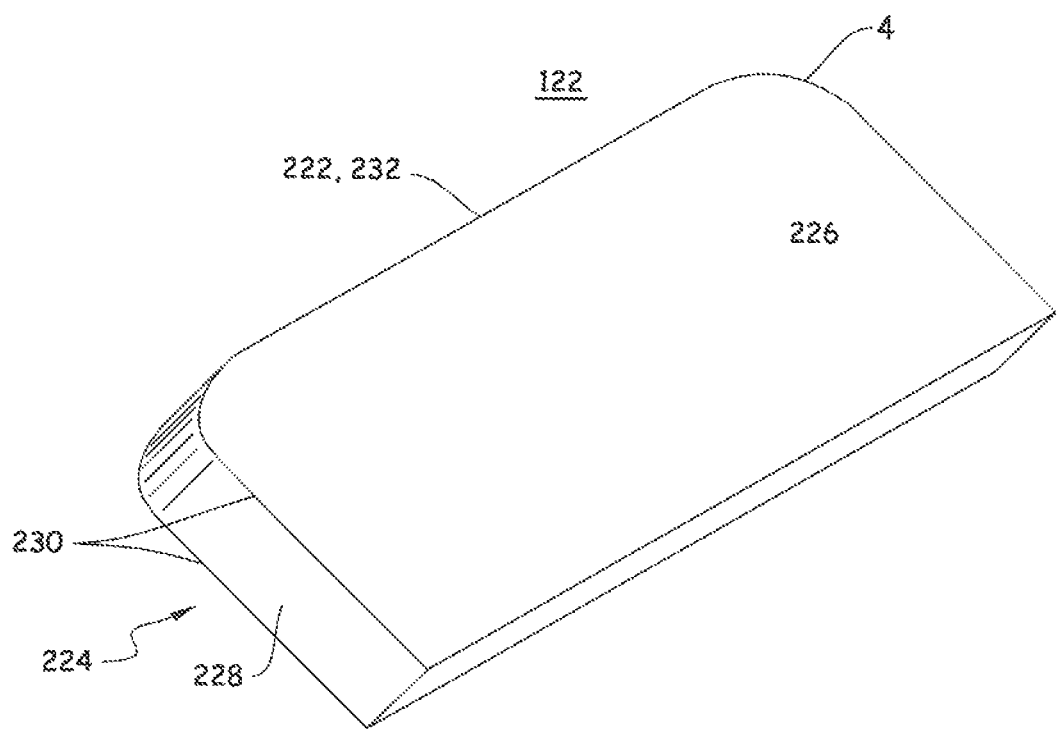
FIG. 17 is a perspective view of an illustrative barrier layer according to the present invention.
Figure 18:
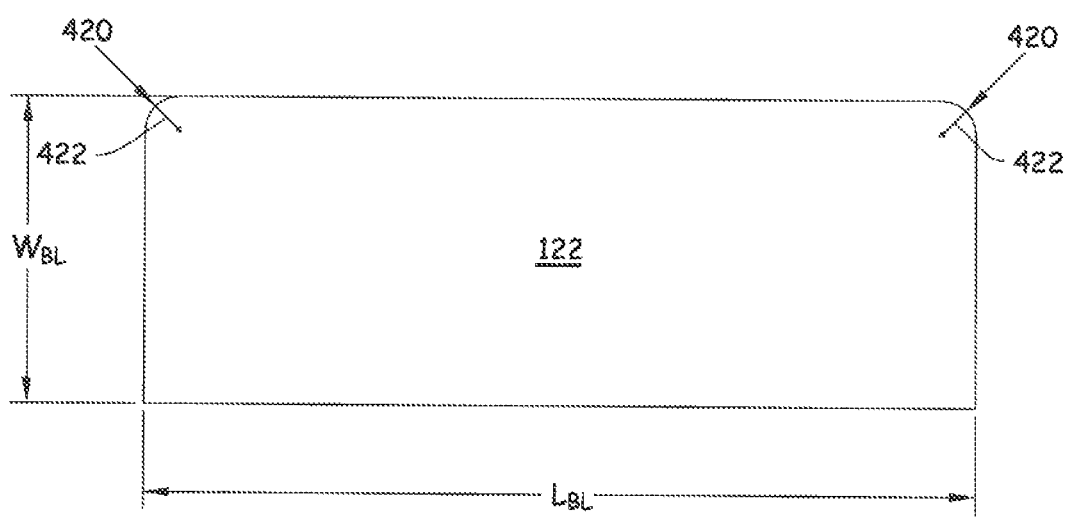
FIG. 18 is a plan view of FIG. 17.
Figure 19:
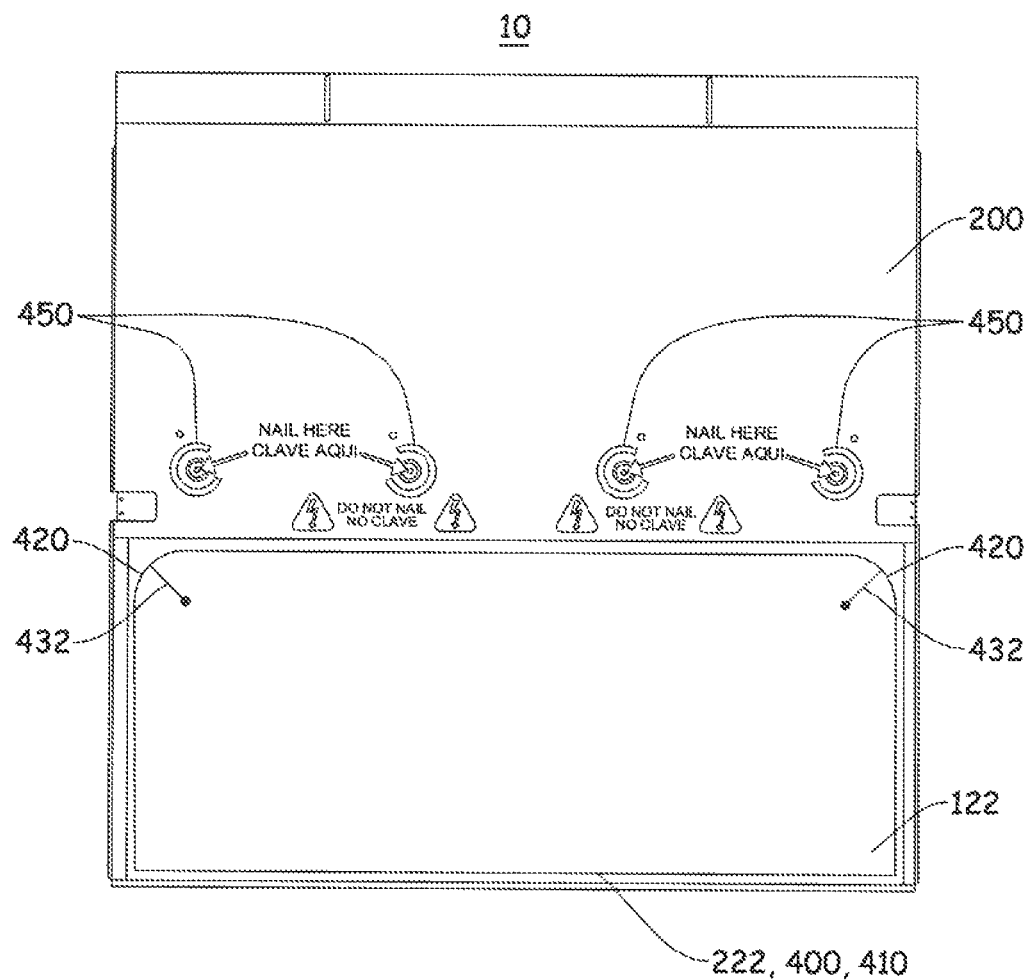
FIG. 19 is a plan view of another illustrative PV device according to the present invention.

In a first illustrative example of unique individual component geometry, shown in FIGS. 17, 18 and 19, the body portion 200 and a portion of the barrier layer 122 are joined (e.g. are in contact) along a segment 400 of the barrier layer peripheral edge 222 (a segment 400 of the perimeter of the barrier's edge). This area where the two parts come together may be known as the interface region 410. It is contemplated that this interface may span across the entire barrier profile 230 or only a portion thereof or onto a portion of the barrier lower surface portion 224, the barrier upper surface portion 226, or both. In this example, the barrier layer is comprised of a glass with physical properties for the glass, as disclose in previous sections of the specification. In this example, the barrier layer peripheral edge 222 has rounded barrier perimeter corners 420 within the segment 400. It is contemplated that the $L_{BL}$ may be equivalent to the $L_{BP}$ and that barrier layer peripheral edge 222 need not have rounded barrier perimeter corners 420 within the segment 400.

In a first preferred embodiment, these rounded corners 420 are located at least in the area of the segment 400 that faces the largest portion of the body portion 200, which can be clearly seen in the figures. Preferably, the rounded barrier perimeter corners 420 have a radius 422 of about 2.0 to 50.0 mm, more preferably about 12.5 mm to 30.0 mm, and most preferably about 17.0 to 27.0 mm.

In a second preferred embodiment, the radius 422 of the rounded barrier perimeter corners 420 is determined as a ratio of the $L_{BL}$ (at least as measured within about 25.0 mm of the interface region 410) to the $L_{BP}$, calculated as ($L_{BL}/L_{BP}$). Preferably, the ratio is about 0.00345 to 0.0862, more preferably about 0.01000 to 0.0500, and most preferably about 0.0400 to 0.0450.

When glass is used (as the barrier layer 122) as in this example, the compositions of the body material preferably have an elongation at break of at least 3% but not typically more than 50%. It is also contemplated, when glass is not used, that the body material preferably has an elongation at break of at least 100%, more preferably at least 200%, more preferably still at least 300% and preferably no more than 500%. The tensile elongation at break of compositions were determined by test method ASTM D638-08 (2008)#23° C. using a test speed of 50 mm/min.

Figure 20:
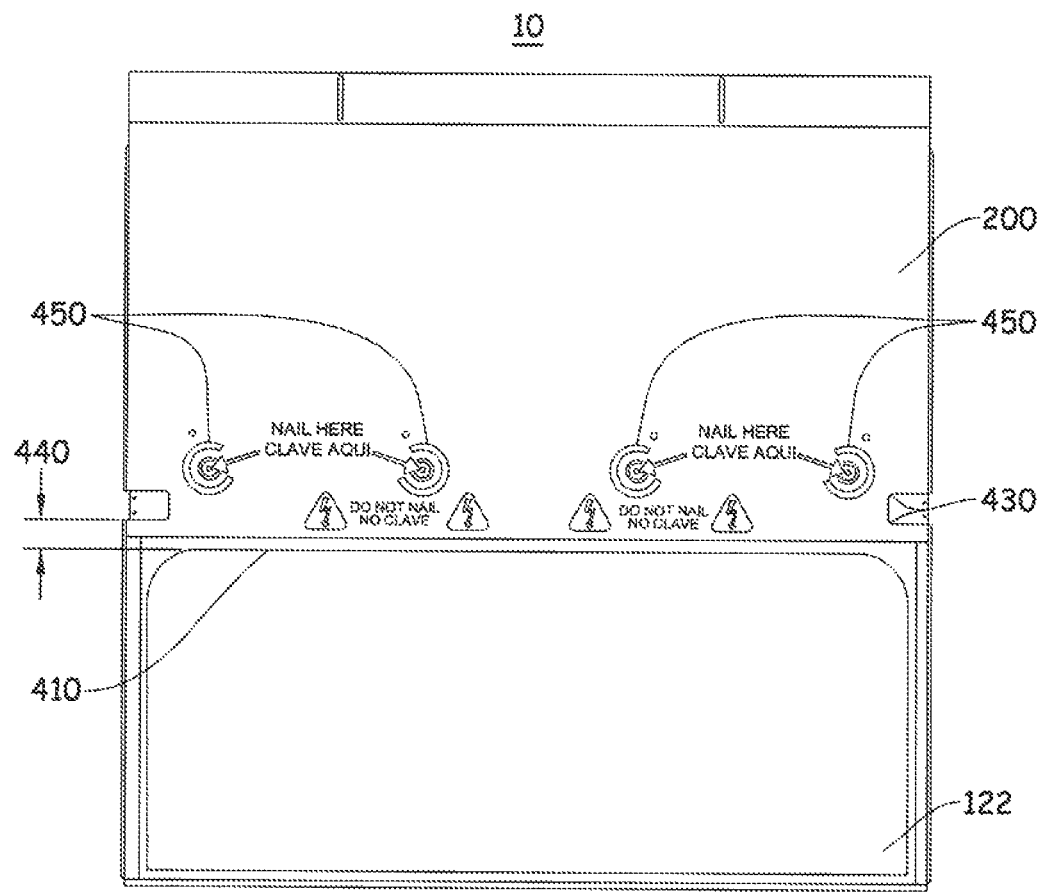
FIG. 20 is a plan view of another illustrative PV device according to the present invention.

In a second illustrative example, shown in FIGS. 3 and 20, the body portion 200 and the barrier layer 122 geometric relationships are maintained. In this example a connector housing 310 is present. It is contemplated and preferred that the connector assembly peripheral edge that is closest to the interface region has at least one rounded connector corner 430 with a radius 432. Generally, the rounded connector corner 430 may have a radius 432 of about 0.1 mm to 15.0 mm, more preferably about 0.5 mm to 5.0 mm, and most preferably about 1.0 mm to 4.0 mm. In this example, the at least one component of the connector assembly (e.g. connector housing 310) is disposed away from the interface region by a disposal distance 440 (e.g. closest point therebetween).

In a first preferred embodiment, a desirous disposal distance 440 (in mm) can be calculated as a relationship between various physical properties of some of the component materials. Preferably, the disposal distance 440 is greater than or equal to X*(body CLTE/barrier CLTE)+C. In a preferred embodiment, X is a constant that ranges from about 1.0 to 4.0, more preferably from about 2.5 to 3.8, and most preferably from about 3.0 to 3.75. In a preferred embodiment, C is a constant that ranges from about 0.5 to 10.0, more preferably from about 1.0 to 5.0, and most preferably from about 1.25 to 3.0.

In a second preferred embodiment, a desirous disposal distance 440 can be calculated as ratio of the $L_{BP}$ (at least as measured within about 25.0 mm of the rounded connector corner 430) to the disposal distance 440 (disposal distance 440/$L_{BP}$=ratio). Preferably, the ratio is about 0.02 to 0.1, more preferably about 0.03 to 0.08, and most preferably about 0.035 to 0.044.

In a third preferred embodiment, the radius 432 (of the at least one rounded connector corner 430) is determined as a ratio of the radius 432 to the $L_{BP}$ (at least as measured within about 25.0 mm of the rounded barrier perimeter corners 420) (radius 432/$L_{BP}$=ratio). Preferably, the ratio is about 0.000172 to 0.0259, more preferably about 0.001000 to 0.015000, and most preferably about 0.001724 to 0.00517.

Other relationships contemplated in the present invention include: The distance between the interface region 410 and the buss bar region 311 relative to the length ($L_{BP}$, particularly within about 25.0 mm of the region 410) of the body portion 200 can be expressed as a ratio. Preferably, this ratio ranges from about 0.00348 to 0.0438, more preferably from about 0.01000 to 0.03000, and most preferably from about 0.01500 to 0.02500. Furthermore, the relationship of the thickness of the body portion (T) in relation to the length ($L_{BP}$, particularly within about 25.0 mm of the region 410) is contemplated as a ratio (T/$L_{BP}$). Preferably, this ratio ranges from about 0.0017 to 0.035, more preferably from about 0.0150 to 0.030, and most preferably from about 0.0100 to 0.0200.

Figure 22:
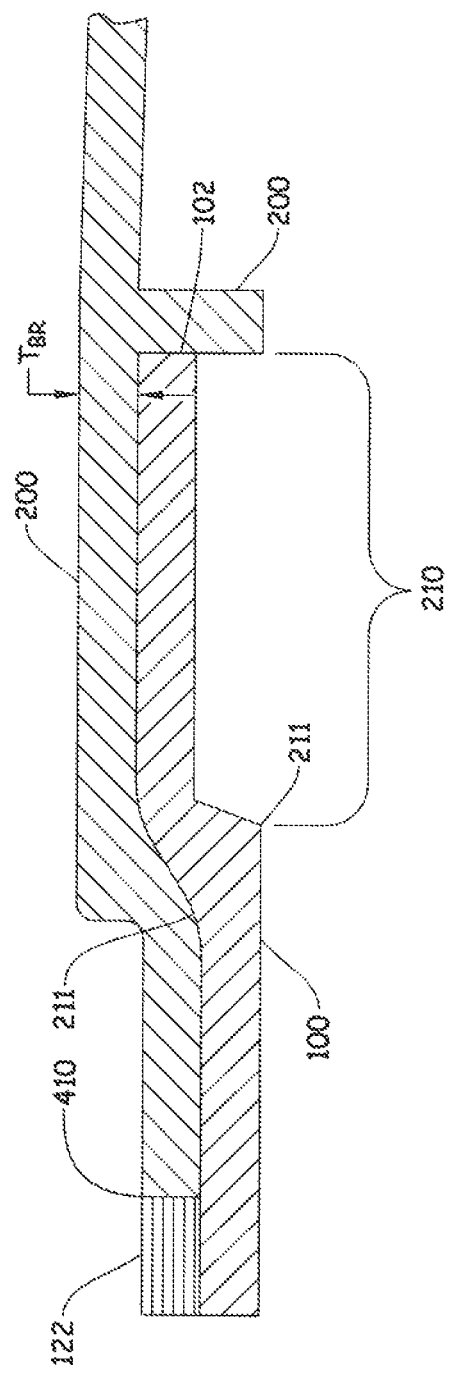
FIG. 22 is a close sectional view of an illustrative bending region according to the present invention.

In a first illustrative example of bending/cant, shown in FIG. 22, a bending region 210 is created with the PV device 10 by reducing the body portion 200 thickness (at least locally) and wherein the MPCA subassembly 101 steps in a direction towards the top surface of the body portion 200. It is contemplated that this bending region 210 preferably starts at least about 5.0 mm away from the interface region and continues to at least about to the top of the MPCA subassembly 101, although it could continue further up the body portion 200.

In a first preferred embodiment, the bending region 210 generally spans across at least about 70% of the length of PV device 10 in an area that the connector housing 310 is and/or the area where the buss bar region 311 is located. The body section 200, in the bending region 210, has a thickness ("$T_{BR}$") of about 2.5 mm to 4.0 mm.

In a second preferred embodiment, a starting point 211 for the bending region 210 is located a distance (in mm) from the interface region and is greater than or equal to X'*(body CLTE/barrier CLTE)+C'. In this preferred embodiment, X' is a constant that ranges from about 1.0 to 5.0, more preferably from about 2.5 to 4.8 and most preferably has a value of 3.75. In this preferred embodiment, C' is a constant that ranges from about 1.0 to 8.0, more preferably from about 2.0 to 6.0 and most preferably from about 3.0 to 5.0.

In a third preferred embodiment, the preferred thickness ("$T_{BR}$") is related to the ratio of the subassembly CLTE to the body CLTE (subassembly CLTE/body CLTE). The thickness ("$T_{BR}$") being about 0.3 to 1.9 times this ratio. Preferably, the ratio is about 1.0 to 5.0, more preferably about 1.5 to 3.5, and most preferably about 1.8 to 2.1.

Figure 23:
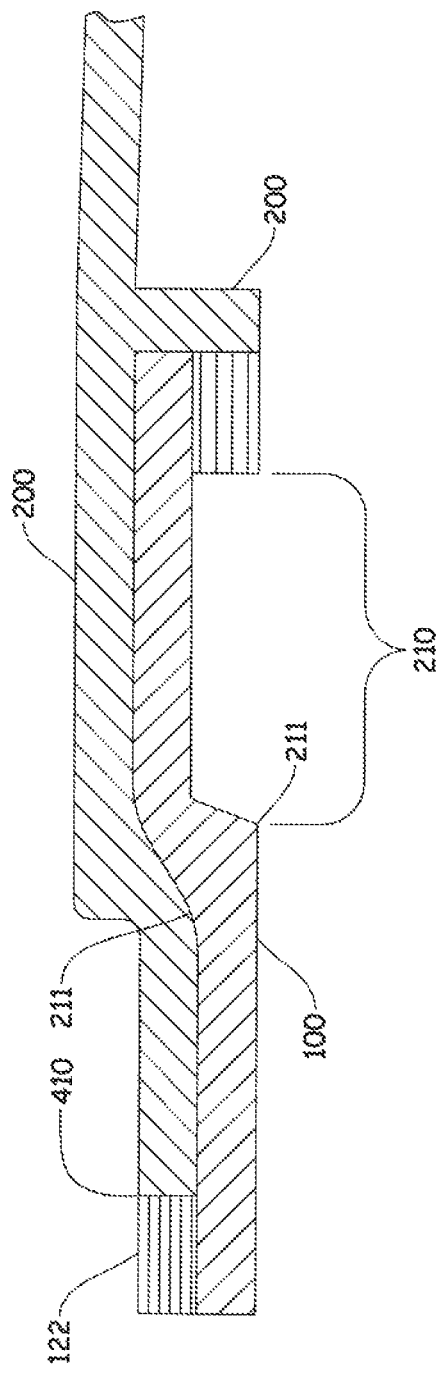
FIG. 23 is a close sectional view of another illustrative bending region according to the present invention.

In a second illustrative example, shown in FIG. 23, the bending region 210 is similar to that of the first example, but the bending region does not continue to the top of the MPCA subassembly 101. The bending region only extends about 50 to 75% of the way to the top of the MPCA subassembly 101 (e.g. in the direction of the width $W_{BP}$).

It is contemplated that the embodiments or examples described above may not be mutually exclusive and may be used in combination with each other.

Unless stated otherwise, dimensions and geometries of the various structures depicted herein are not intended to be restrictive of the invention, and other dimensions or geometries are possible. Plural structural components can be provided by a single integrated structure. Alternatively, a single integrated structure might be divided into separate plural components. In addition, while a feature of the present invention may have been described in the context of only one of the illustrated embodiments, such feature may be combined with one or more other features of other embodiments, for any given application. It will also be appreciated from the above that the fabrication of the unique structures herein and the operation thereof also constitute methods in accordance with the present invention.

Unless otherwise stated, the coefficient of linear expansion ("CLTE") for the materials and assemblies disclosed herein is determined on a TA Instruments TMA Model 2940 by test method ASTM E1824-08 (2008) in a temperature range of −40° C. and 90° C., at 5° C. per minute, using the standard software provided with the instrument. The skilled artisan will appreciate that a composition may exhibit temperature ranges where the CLTE changes from other regions as the material undergoes thermal transitions. In such a case, the preferred ranges for CLTE above refer to the largest measured CLTE for the compositions, assemblies and/or barrier layer 122. A photovoltaic device may include many different materials, including materials with very different CLTE. For example, a PV assembly may include solar cells, metal conductors, polymeric encapsulants, barrier materials such as glass, or other disparate materials, all with different CLTE's. The CLTE of a PV assembly may be determined by measuring the dimensions of the assembly at a number of temperatures between −40° C. and 90° C. This temperature range is also assumed for all other physical properties (testing) unless otherwise specified.

The preferred embodiment of the present invention has been disclosed. A person of ordinary skill in the art would realize however, that certain modifications would come within the teachings of this invention. Therefore, the following claims should be studied to determine the true scope and content of the invention.

Any numerical values recited in the above application include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

Unless otherwise stated, all ranges include both endpoints and all numbers between the endpoints. The use of "about" or "approximately" in connection with a range applies to both ends of the range. Thus, "about 20 to 30" is intended to cover "about 20 to about 30", inclusive of at least the specified endpoints.

The disclosures of all articles and references, including patent applications and publications, are incorporated by reference for all purposes. This application is a national phase filing under 35 USC §371 from PCT Application serial number PCT/US2011/064393 filed on 12 Dec. 2011, and claims priority therefrom. This application further claims priority from US Provisional Application 61/424,325 flied 17 Dec. 2010 both incorporated herein by reference.

The term "consisting essentially of" to describe a combination shall include the elements, ingredients, components or steps identified, and such other elements ingredients, components or steps that do not materially affect the basic and novel characteristics of the combination.

The use of the terms "comprising" or "including" describing combinations of elements, ingredients, components or steps herein also contemplates embodiments that consist essentially of the elements, ingredients, components or steps.

Plural elements, ingredients, components or steps can be provided by a single integrated element, ingredient, component or step. Alternatively, a single integrated element, ingredient, component or step might be divided into separate plural elements, ingredients, components or steps. The disclosure of "a" or "one" to describe an element, ingredient, component or step is not intended to foreclose additional elements, ingredients, components or steps. All references herein to elements or metals belonging to a certain Group refer to the Periodic Table of the Elements published and copyrighted by CRC Press, Inc., 1989. Any reference to the Group or Groups shall be to the Group or Groups as reflected in this Periodic Table of the Elements using the IUPAC system for numbering groups.

What is claimed is:

1. A photovoltaic device comprising:
   a three-dimensional multi-layered photovoltaic cell assembly in the form of a panel including at least:
      a top surface,
      a bottom surface, and
      a peripheral edge extending between and connecting the top surface to the bottom surface, the peripheral edge including a length and a width;
      further including a barrier layer comprising a rigid material that is transparent or translucent;
   a body portion comprising:
      filled or unfilled moldable plastic material,
      a main body portion,
      a first frame portion, and
      a second frame portion extending from an opposite side of the main body portion as the first frame portion and an empty region located between the first frame portion and the second from portion; and
      wherein the body portion is at least partially surrounding a portion of the top surface and the peripheral edge of the three-dimensional multi-layered photovoltaic cell assembly, and the main body portion has a bottom peripheral edge extending between and connecting the first frame portion and the second frame portion;

a relieving feature disposed in the main body portion that is a localized thinning of the main body portion, the localized thinning of the main body portion extending along the bottom peripheral edge of the main body portion and being located outside of the peripheral edge of the three-dimensional multi-layered photovoltaic cell assembly so that the relieving feature allows elastic deformation of the photovoltaic device over a temperature range, wherein the localized thinning has a depth of at least 50 percent that of a depth of the three-dimensional multi-layered photovoltaic cell assembly, and wherein the localized thinning of the main body portion is a channel; and at least one electrical connector assembly with a connector housing, the connector housing having an outer surface having a housing top surface, a housing bottom surface, and a housing peripheral edge connecting the housing top surface and the housing bottom surface, and the at least one connector housing is located between a portion of the relieving feature and the bottom peripheral edge of the main body portion.

2. The photovoltaic device according to claim 1, wherein the at least one electrical connector assembly is two electrical connector assemblies disposed on opposite sides of the three dimensional multi-layered photovoltaic cell assembly.

3. The photovoltaic device according to claim 1, wherein the relieving feature is disposed in the main body portion within 15.0 mm of the barrier layer of the three-dimensional multi-layered photovoltaic cell assembly along at least 50 percent of a top peripheral edge of the multi-layered photovoltaic cell assembly, and wherein the top peripheral edge of the three-dimensional multi-layered photovoltaic cell assembly is located proximate to the bottom peripheral edge of the main body portion.

4. The photovoltaic device according to claim 1, wherein the housing peripheral edge of the connector housing includes a top peripheral edge and a bottom peripheral edge and the bottom peripheral edge is located proximate to the three-dimensional multi-layered photovoltaic cell assembly and the top peripheral edge is located opposite the bottom peripheral edge, and the relieving feature is disposed in the main body portion within 5.0 mm of the top peripheral edge of the connector housing.

5. The photovoltaic device according to claim 1, wherein the barrier layer is comprised of a glass with a thickness of 1.0 to 5.0 mm.

6. The photovoltaic device according to claim 1, wherein at least the body portion is comprised of:

a body material with a body coefficient of linear thermal expansion, the body portion with a body lower surface portion, body upper surface portion and a body side surface portion spanning between the upper and lower surface portions and forming a body peripheral edge, wherein at least a portion of the body portion abuts to a segment of a barrier layer peripheral edge at an interface region;

wherein the at least one electrical connector assembly further includes at least one component at least partially embedded in the body side surface portion and the connector assembly component includes a connector assembly lower surface portion, a connector assembly upper surface portion and a connector assembly side surface portion spanning between the upper and lower surface portions which forms a connector assembly peripheral edge, wherein the connector assembly peripheral edge that is closest to the interface region has at least one rounded connector corner, and the connector assembly is in electrical communication with a photovoltaic cell layer of the photovoltaic cell assembly.

7. The photovoltaic device according to claim 1, wherein:
the multilayered photovoltaic cell assembly is comprised of:

the barrier layer with a barrier layer material having a barrier coefficient of linear thermal expansion and a photovoltaic cell layer disposed inboard of a barrier layer peripheral edge, the barrier layer including a barrier lower surface portion, a barrier upper surface portion and a barrier side surface portion spanning between the upper and lower surface portions with a barrier profile between the upper and lower surface portions and a barrier perimeter spanning about the barrier layer which forms the barrier layer peripheral edge;

the body portion comprised of:

a body material with a body coefficient of linear thermal expansion, the body portion with a body lower surface portion, body upper surface portion and a body side surface portion spanning between the upper and lower surface portions and forming a body peripheral edge, wherein at least a portion of the body portion abuts to a segment of the barrier layer peripheral edge at an interface region.

8. The photovoltaic device according to claim 1, comprising an intermediate layer comprised of a layer material and including a layer elastic modulus value, a layer ultimate elongation value, a layer coefficient of thermal expansion value and a layer strength value, wherein the intermediate layer is at least partially disposed between the three-dimensional multi-layered photovoltaic cell assembly and the body portion.

9. The photovoltaic device according to claim 1, wherein the body portion is around at least a portion of the peripheral edge of the multi-layered photovoltaic cell assembly and a bottom of the three-dimensional multi-layered photovoltaic cell assembly is a bottom of the photovoltaic device at the three-dimensional multi-layered photovoltaic cell assembly.

10. The photovoltaic device according to claim 1, wherein the localized thinning of the main body portion has a width that is about 2.5 mm to 12.5 mm.

11. The photovoltaic device according to claim 10, wherein the barrier layer includes corners with a barrier layer peripheral edge extending therebetween and the relieving feature extends along at least about 50 percent of the barrier layer peripheral edge between the corners.

12. The photovoltaic device according to claim 11, wherein the relieving feature is located along at least about 90 percent of the barrier layer peripheral edge between the corners.

13. The photovoltaic device according to claim 10, wherein the relieving feature directly abuts the connector housing.

14. The photovoltaic device according to claim 10, wherein the body portion is around at least a portion of the peripheral edge of the multi-layered photovoltaic cell assembly and a bottom of the three-dimensional multi-layered photovoltaic cell assembly is a bottom of the photovoltaic device at the three-dimensional multi-layered photovoltaic cell assembly.

\* \* \* \* \*

UNITED STATES PATENT AND TRADEMARK OFFICE
CERTIFICATE OF CORRECTION

| | | |
|---|---|---|
| PATENT NO. | : 9,602,046 B2 | Page 1 of 1 |
| APPLICATION NO. | : 13/989172 | |
| DATED | : March 21, 2017 | |
| INVENTOR(S) | : Jason A. Reese et al. | |

It is certified that error appears in the above-identified patent and that said Letters Patent is hereby corrected as shown below:

In the Claims

Column 22, Line 65 delete "second from portion;" and insert --second frame portion;--

Signed and Sealed this
Sixteenth Day of May, 2017

Michelle K. Lee
*Director of the United States Patent and Trademark Office*